US012720978B2

(12) United States Patent
Sun et al.

(10) Patent No.: US 12,720,978 B2
(45) Date of Patent: Aug. 25, 2026

(54) DISPLAY PANEL AND DISPLAY APPARATUS

(71) Applicant: BOE TECHNOLOGY GROUP CO., LTD., Beijing (CN)

(72) Inventors: Zhongyuan Sun, Beijing (CN); Jinxiang Xue, Beijing (CN); Wenqi Liu, Beijing (CN); Jingkai Ni, Beijing (CN); Che An, Beijing (CN); Weijie Wang, Beijing (CN); Fengjie Zhang, Beijing (CN); Guangcai Yuan, Beijing (CN); Fang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 608 days.

(21) Appl. No.: 18/252,643

(22) PCT Filed: Apr. 20, 2022

(86) PCT No.: PCT/CN2022/088001
§ 371 (c)(1),
(2) Date: May 11, 2023

(87) PCT Pub. No.: WO2023/201585
PCT Pub. Date: Oct. 26, 2023

(65) Prior Publication Data
US 2024/0341135 A1 Oct. 10, 2024

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
None
See application file for complete search history.

(56) References Cited

U.S. PATENT DOCUMENTS 9,754,975 B2 * 9/2017 Lee ...................... H10D 86/411
2004/0009729 A1 * 1/2004 Hill ...................... D03D 11/00
442/181

(Continued)

FOREIGN PATENT DOCUMENTS

CN 1322837 C 6/2007
CN 101523469 B 5/2012

(Continued)

*Primary Examiner* — Bryan R Junge
(74) *Attorney, Agent, or Firm* — XSENSUS LLP

(57) ABSTRACT

A display panel includes: a plurality of first strip-shaped circuit boards extending in a first direction, a plurality of second strip-shaped circuit boards extending in the second direction, a plurality of pixel units, a plurality of first braided lines and a plurality of second braided lines. The plurality of second strip-shaped circuit boards and the plurality of first strip-shaped circuit boards are arranged in a cross way. A pixel unit is located at an intersection position between a second strip-shaped circuit board and a first strip-shaped circuit board, and is electrically connected to both the first strip-shaped circuit board and the second strip-shaped circuit board that cross at the intersection position. The plurality of first braided lines and the plurality of second braided lines are connected with the plurality of first strip-shaped circuit boards and the plurality of second strip-shaped circuit boards in a braiding way.

18 Claims, 15 Drawing Sheets

(56) References Cited

U.S. PATENT DOCUMENTS

2004/0245915 A1 12/2004 Miki
2005/0081944 A1 4/2005 Carpinelli et al.
2005/0231680 A1 10/2005 Hioki et al.
2008/0196783 A1* 8/2008 Van Bruggen ......... D03D 11/00 139/319
2009/0033856 A1 2/2009 Kiryuschev et al.
2010/0201610 A1* 8/2010 Lo ......................... G06F 3/1446 345/82
2012/0127687 A1* 5/2012 Allee ........................ G09F 9/33 139/11
2021/0025083 A1 1/2021 Haiberger et al.

FOREIGN PATENT DOCUMENTS

CN 108269825 A 7/2018
CN 108281458 A 7/2018
CN 110311054 A 10/2019
CN 213815389 U 7/2021
JP 2007314925 A 12/2007

* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2022/088001, filed on Apr. 20, 2022, which is incorporated herein by reference in its entirety.

TECHNICAL FIELD

The present disclosure relates to the field of display technologies, and in particular, to a display panel and a display apparatus.

BACKGROUND

Organic light-emitting diodes (OLEDs) have a series of advantages such as all-solid-state structure, high brightness, full viewing angle, fast response, wide operating temperature range, and capable of achieving flexible display. Compared with liquid crystal display, OLED may be bendable, and thus has a wide application range, especially in the field of flexible display. The OLED may be rolled and folded, so it has a very broad prospect in the fields of portable products or wearable products.

After years of technology accumulation, the current curved products have gradually developed into foldable and even stretchable products. The stretchable display apparatus can be bent and folded, and can be stretched and deformed due to the action of an external force.

SUMMARY

In an aspect, a display panel is provided. The display panel includes a plurality of first strip-shaped circuit boards, a plurality of second strip-shaped circuit boards, a plurality of pixel units, a plurality of first braided lines and a plurality of second braided lines. The plurality of first strip-shaped circuit boards all extend in the first direction, and the plurality of second strip-shaped circuit boards all extend in the second direction. The second direction Y and the first direction X intersect. The plurality of second strip-shaped circuit boards and the plurality of first strip-shaped circuit boards are arranged in a cross way. A pixel unit is located at an intersection position between a second strip-shaped circuit board in the plurality of second strip-shaped circuit boards and a first strip-shaped circuit board in the plurality of first strip-shaped circuit boards, and is electrically connected to both the first strip-shaped circuit board and the second strip-shaped circuit board that cross at the intersection position. The plurality of first braided lines all extend in the first direction, and the plurality of first braided lines and the plurality of first strip-shaped circuit boards are arranged alternately. The plurality of second braided lines all extend in the second direction, and the plurality of second braided lines and the plurality of second strip-shaped circuit boards are arranged alternately. The plurality of first braided lines and a plurality of second braided lines are connected with the plurality of first strip-shaped circuit boards and the plurality of second strip-shaped circuit boards in a braiding way.

In some embodiments, the pixel unit is fixed on the first strip-shaped circuit board, and the pixel unit is in sliding contact with the second strip-shaped circuit board.

In some embodiments, the first strip-shaped circuit board includes a first base and a first conductive layer. The first conductive layer includes at least one signal line, the first conductive layer is located on a side of the first base away from the second strip-shaped circuit board, and the at least one signal line is electrically connected to the pixel unit.

In some embodiments, the pixel unit includes a driving circuit layer. The driving circuit layer is located on the side of the first base away from the second strip-shaped circuit board, and the driving circuit layer includes a source-drain metal layer. The first conductive layer and the source-drain metal layer are disposed in a same layer.

In some embodiments, the first strip-shaped circuit board further includes an organic layer located between the first base and the first conductive layer. The organic layer is in contact with a side surface of the driving circuit layer.

In some embodiments, the pixel unit further includes a barrier layer and a buffer layer. The barrier layer is located between the first base and the driving circuit layer. The buffer layer is located between the barrier layer and the driving circuit layer. Both a side surface of the barrier layer and a side surface of the buffer layer are in contact with the organic layer.

In some embodiments, two opposite edges of the buffer layer in the first direction are retracted relative to two opposite edges of the barrier layer in the first direction.

In some embodiments, the driving circuit layer further includes a pixel planarization layer, and the pixel planarization layer is located on a side of the source-drain metal layer away from the first base. The first strip-shaped circuit board further includes a first planarization layer, and the first planarization layer is located on a side of the first conductive layer away from the first base. The pixel planarization layer is disposed in a same layer as the first planarization layer.

The pixel unit further includes a light-emitting device layer and an encapsulation layer. The light-emitting device layer is located on a side of the pixel planarization layer away from the first base. The encapsulation layer is located on a side of the light-emitting device layer away from the first base. The encapsulation layer separates the pixel planarization layer from the first planarization layer.

In some embodiments, the pixel unit further includes a blocking layer. The blocking layer is located between the pixel planarization layer and the first planarization layer. A surface of the blocking layer away from the first base is provided at least one groove therein, and the encapsulation layer fills the at least one groove.

In some embodiments, the light-emitting device layer includes at least one light-emitting device. The at least one groove includes a plurality of annular grooves each surrounding a light-emitting device and arranged diffusely from inside to outside.

In some embodiments, a number of the annular grooves is in a range of 2 to 6, inclusive.

In some embodiments, a thickness of the blocking layer is in a range of 0.4 μm to 1.4 μm, inclusive. A depth of an annular groove is in a range of 0.2 μm to 1.2 μm, inclusive. A width of the annular groove is in a range of 3 μm to 8 μm, inclusive. A distance between two adjacent annular grooves is in a range of 3 μm to 8 μm, inclusive.

In some embodiments, the first strip-shaped circuit board further includes a protective cover plate and a first adhesive layer. The protective cover plate covers the first planarization layer and the encapsulation layer. The first adhesive layer is located between the protective cover plate and both the first planarization layer and the encapsulation layer.

In some embodiments, the second strip-shaped circuit board includes a second base and a second conductive layer. The second conductive layer is at least on a side of the second base proximate to the first base, and the second conductive layer is electrically connected to the driving circuit layer.

In some embodiments, the display panel further includes a plurality of contact layers. At least one contact layer is located at the intersection position between the second strip-shaped circuit board in the plurality of second strip-shaped circuit boards and the first strip-shaped circuit board in the plurality of first strip-shaped circuit boards, and is located between the first base and the second conductive layer. The driving circuit layer further includes a gate metal layer. The gate metal layer is fixedly and electrically connected to the contact layer through a via hole penetrating the first base; and the contact layer is slidably electrically connected to the second conductive layer.

In some embodiments, at least one end of the gate metal layer in the second direction extends to a side of the first base away from the source-drain metal layer, and is slidably electrically connected to the second conductive layer.

In some embodiments, the first strip-shaped circuit board further includes an organic layer located between the first base and the first conductive layer, and between the gate metal layer and the first base.

In some embodiments, the pixel unit includes a driving circuit layer located on the side of the first base away from the second strip-shaped circuit board, and the driving circuit layer includes a source-drain metal layer. The first strip-shaped circuit board further includes a wire core. The wire core is located on a side of the first base away from the source-drain metal layer; and the first base is fixed around the wire core.

In some embodiments, the plurality of first strip-shaped circuit boards, the plurality of second strip-shaped circuit boards, the plurality of first braided lines and the plurality of second braided lines are braided into a planar structure by a plain weaving method.

In another aspect, a display apparatus is provided. The display apparatus includes the display panel as described in any of the above embodiments and a driver chip. The driver chip is disposed on the first strip-shaped circuit board; and the driver chip IS configured to provide a power signal and a data signal for the pixel unit.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
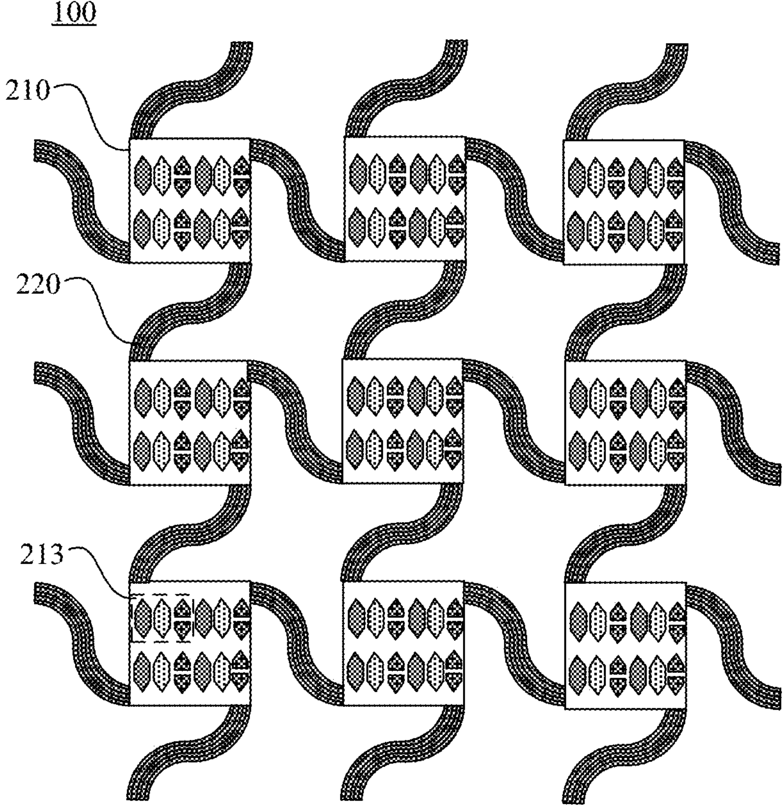
FIG. 1 is a structural diagram of a display panel, in accordance with some embodiments of the present disclosure.

Technical solutions in some embodiments of the present disclosure will be described clearly and completely with reference to the accompanying drawings below.

Obviously, the described embodiments are merely some but not all embodiments of the present disclosure. All other embodiments obtained by a person having ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, term "a plurality of" or "the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display panel 100. As shown in FIG. 1, the display panel 100 adopts a flexible and stretchable display technology solution. The display panel 100 includes a plurality of display islands 210 and a plurality of connection units 220. The plurality of display islands 210 are arranged in an array, and adjacent display islands 210 are electrically connected through a connection unit 220.

Figure 2:
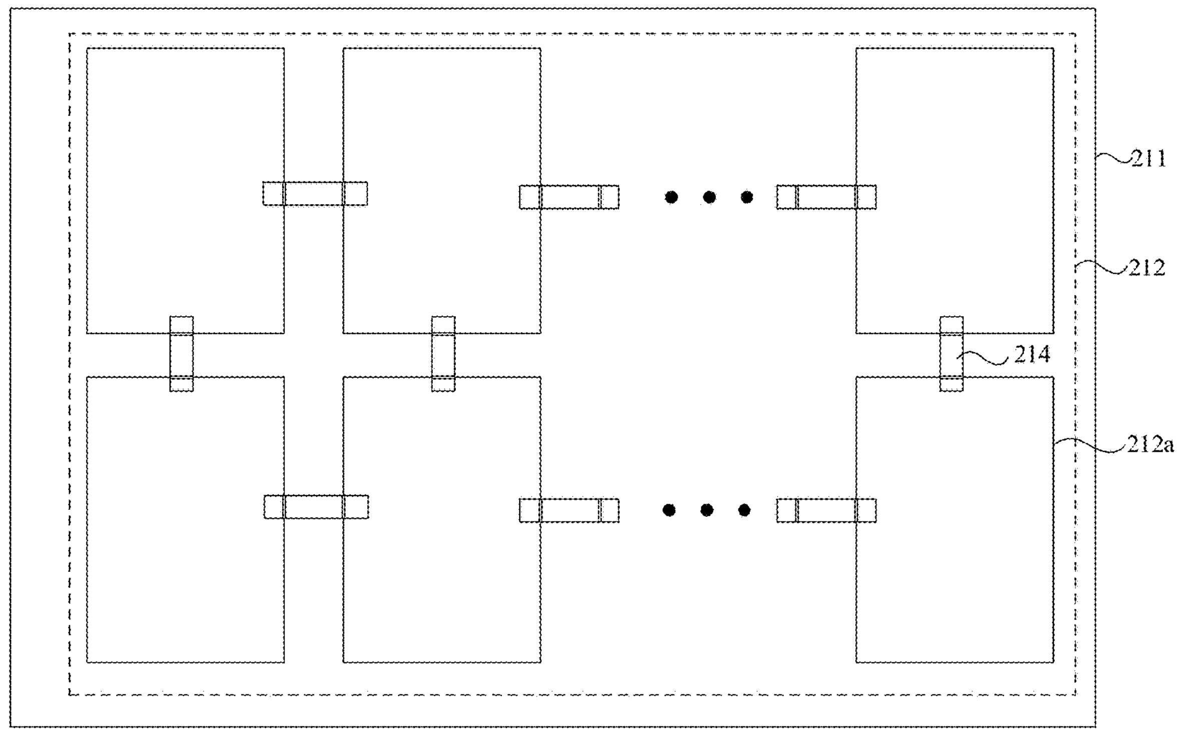
FIG. 2 is a structural diagram of a substrate and a barrier layer in a display island, in accordance with some embodiments of the present disclosure.
Figure 3:
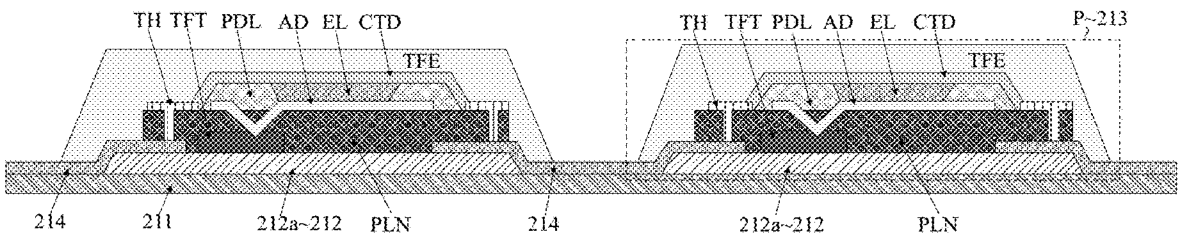
FIG. 3 is a partial cross-sectional view of a display island, in accordance with some embodiments of the present disclosure.

In some embodiments, as shown in FIGS. 2 and 3, where FIG. 2 is a structural diagram with an island-shaped barrier layer 212 and a substrate 211 installed, and FIG. 3 is a cross-sectional view of a partial area of the display island, each display island includes a substrate 211, an island barrier layer 212, a plurality of pixels 213 and a plurality of connection lines 214. The substrate 211 is connected to connection units. The substrate 211 is provided with the island-shaped barrier layer 212 thereon, and the island-shaped barrier layer 212 includes a plurality of barrier portions 212*a*. The plurality of pixels 213 is disposed on a side of the island-shaped barrier layer 212 away from the substrate 211, each pixel 213 includes a plurality of sub-pixels p, and each sub-pixel p is located on a barrier portion 212*a*. The connecting line 214 is provided between adjacent barrier portions 212*a*. One end of the connecting line 214 is disposed on a side of the barrier portion 212*a* away from the substrate 211, and the other end of the connecting line 214 is disposed on a side of another barrier portion 212*a* adjacent to the barrier portion 212*a* away from the substrate 211. The sub-pixel p located on the barrier portion 212*a* is electrically connected to a corresponding connection line 214.

In some examples, the substrate 211 is made of a rigid material. For example, the substrate 211 may be a silicon substrate. A connection unit is provided between adjacent substrates 211, and the connection unit is elastic conductive lines. The substrate 211 does not withstand stretching variation, and the connection unit 220 may withstand tensile deformation along the direction of the conductive lines, so as to realize the stretching of the entire display panel 100.

The substrate 211 is provided with the island-shaped barrier layer 212 thereon. The island-shaped barrier layer 212 is etched to form a plurality of barrier portions 212*a*, and each barrier portion 212*a* is separated from each other. Each barrier portion 212*a* is provided with a sub-pixel p on a side away from the substrate 211, the connection line 214 is provided between adjacent barrier portions 212*a*, and the sub-pixel p is electrically connected to the corresponding connection line 214.

In some embodiments, the sub-pixel p includes a thin film transistor device layer TFT, a pixel planarization layer PLN, a pixel defining layer PDL, an anode AD, a light-emitting portion EL and a cathode CTD. The thin film transistor device layer TFT is disposed on a side of the barrier portion 212*a* away from the substrate 211, the pixel planarization layer PLN is disposed on a side of the thin film transistor device layer TFT away from the substrate 211, and the pixel defining layer PDL and the anode AD are disposed on a side of the pixel planarization layer PLN away from the substrate 211. The pixel defining layer PDL includes openings each for defining the position of the light-emitting device, and the anode AD is located in the corresponding opening. The anode AD passes through a via hole of the pixel planarization layer PLN to be electrically connected with the thin film transistor device layer TFT. The light-emitting portion EL is disposed on a side of the anode AD located in the opening away from the substrate 211, and the cathode CTD is disposed on a side of the light-emitting portion EL away from the substrate 211. Each of two ends of the cathode CTD extends from the side of the pixel defining layer PDL away from the substrate 211 to the side of the pixel planarization layer PLN away from the substrate 211, and the two ends of the cathode CTD located on the side of the pixel planarization layer PLN away from the substrate 211 are each connected to a respective connection line 214 by a connection member TH of the pixel planarization layer PLN.

In some embodiments, as shown in FIG. 3, the display island 210 further includes an encapsulation layer TFE. The encapsulation layer TFE is disposed on a side of the cathode CTD away from the substrate 211, and the encapsulation layer TFE extends to the substrate 211 to encapsulate a side face of the barrier layer 212 and the pixel 213.

In a process of stretching the display panel 100 in the above embodiments, that is, when a border of the display panel 100 is subjected to an external tensile force, connecting units 220 in the border area of the display panel 100 have relatively large deformation, and connecting units 220 in the middle area of the display panel 100 have relatively small deformation. Accordingly, a display image of the display panel 100 may be out of shape after being stretched.

In addition, the display panel 100 in the above-mentioned embodiments includes the display islands 210, and the display island 210 includes the plurality of pixels 213. The display island 210 serves as a display unit of the display panel 100, and each display island 210 includes an image block of a display image. The display island 210 adopts the substrate 211 made of a rigid material. When the connecting unit 220 connected to the display island 210 is deformed by tensile force, the display island 210 will not be deformed. That is, after the display panel 100 is stretched, the distances between image blocks of the display image are enlarged, rather than a uniform amplification of the entire display image. As a result, when the amount of stretching is excessively large, the display image is severely deformed, and the image may not be recognizable.

Figure 4:
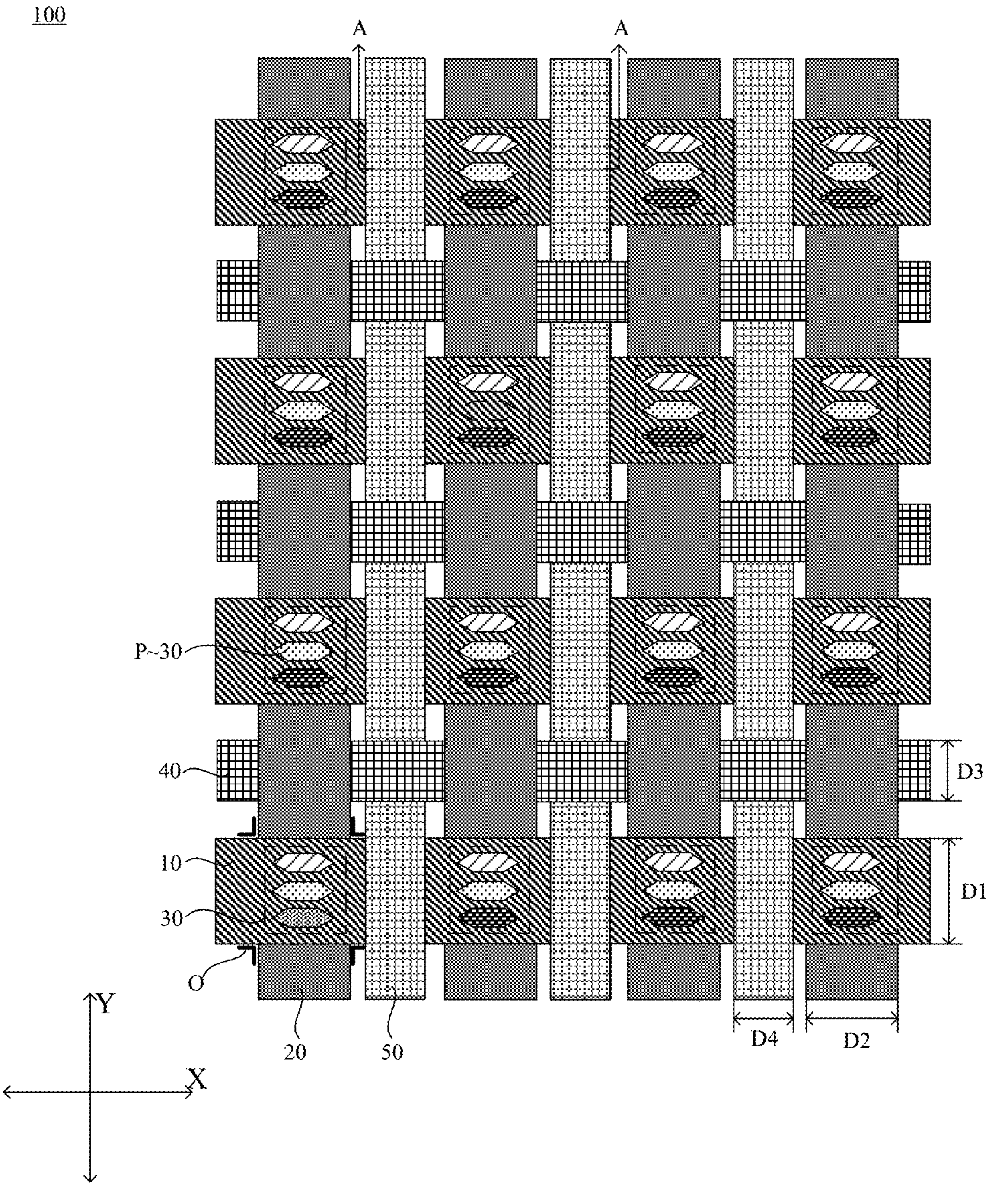
FIG. 4 is a structural diagram of another display panel, in accordance with some embodiments of the present disclosure.

In light of this, in an aspect, some embodiments of the present disclosure provide a display panel 100. As shown in FIG. 4, the display panel 100 includes a plurality of first strip-shaped circuit boards 10, a plurality of second strip-shaped circuit boards 20, a plurality of pixel units 30, a plurality of first braided lines 40 and a plurality of second braided lines 50. The plurality of first strip-shaped circuit boards 10 all extend in a first direction X. The plurality of second strip-shaped circuit boards 20 all extend in a second direction Y. The second direction Y intersects with the first direction X. The plurality of second strip-shaped circuit boards 20 and the plurality of first strip-shaped circuit boards 10 are arranged in a cross way. A pixel unit 30 is located at an intersection position O between a second strip-shaped circuit board 20 in the plurality of second strip-shaped circuit boards 20 and a first strip-shaped circuit board 10 in the plurality of first strip-shaped circuit boards 10, and is electrically connected to both the first strip-shaped circuit board 10 and the second strip-shaped circuit board 20 that cross at the intersection position O.

The plurality of first braided lines 40 all extend in the first direction X, and the first braided lines 40 and the first strip-shaped circuit boards 10 are alternately arranged. The plurality of second braided lines 50 all extend in the second direction Y, and the second braided lines 50 and the second strip-shaped circuit boards 20 are arranged alternately. The plurality of first braided lines 40 and the plurality of second braided lines 50 are connected with the plurality of first strip-shaped circuit boards 10 and the plurality of second strip-shaped circuit boards 20 in a braiding way.

In some examples, the plurality of first strip-shaped circuit boards 10 are all arranged in the first direction X, and the first strip-shaped circuit board 10 has elasticity in the first direction X. The first strip-shaped circuit board 10 may have a strip structure with a substantially square cross section, and a width D1 of the first strip-shaped circuit board 10 may be in a range from 0.23 mm to 3.00 mm, inclusive. For example, the width D1 of the first strip-shaped circuit board 10 may be 0.23 mm, 0.27 mm or 3.00 mm. The width D1 of the first strip-shaped circuit board 10 refers to a distance of the first strip-shaped circuit board 10 in a direction parallel to the second direction Y and perpendicular to the first direction X.

In some examples, the plurality of second strip-shaped circuit boards 20 are arranged in the second direction Y, and the second strip-shaped circuit board 20 has elasticity in the second direction Y. The first direction X and the second direction Y may be, for example, perpendicular to each other. The second strip-shaped circuit board 20 may have a strip structure with a substantially square cross section, and a width D2 of the second strip-shaped circuit board 20 may be in a range from 0.23 mm to 3.00 mm, inclusive. For example, the width D2 of the second strip-shaped circuit board 20 may be 0.23 mm, 0.27 mm or 3.00 mm. The width D2 of the second strip-shaped circuit board 20 refers to a distance of the second strip-shaped circuit board 20 in a direction parallel to the first direction X and perpendicular to the second direction Y.

In some examples, the plurality of first strip-shaped circuit boards 10 and the plurality of second strip-shaped circuit boards 20 cross to form a plurality of intersection positions O. Each intersection position O is provided with a pixel unit 30, and the pixel unit 30 is electrically connected to the first strip-shaped circuit board 10 and the second strip-shaped circuit board 20. The first strip-shaped circuit board 10 and the second strip-shaped circuit board 20 are also configured to provide electrical signals for the pixel unit 30. The display unit 30 includes the light-emitting device, and the light-emitting device may adopt an organic light-emitting diode (OLED), a micro organic light-emitting diode (Micro OLED), a quantum dot light-emitting diode (QLED), a mini light-emitting diode (Mini LED), or a micro light-emitting diode (Micro LED). In the embodiments of the present disclosure, the OLED is taken as an example of the light-emitting device of the pixel unit 30, and the type of the light-emitting device is not particularly limited here.

In some examples, the plurality of first braided lines 40 extend in the first direction X, and 1 to 4 first braided lines 40 are provided between two adjacent first strip-shaped circuit boards 10. For example, the number of the first braided lines 40 between the two adjacent first strip-shaped circuit boards 10 may be 1, 3 or 4. The first braided line 40 may be natural fiber, chemical fiber product, or a mixture of natural fiber and chemical fiber product. For example, the natural fiber may be cotton thread, hemp thread, silk thread, woolen thread, or the like, and the chemical fiber product may be nylon, polyester, spandex, chinlon, or the like. The first braided line 40 may be a line strip with a substantially circular or square cross section, and a diameter D3 or width D3 of the first braided line 40 may be in a range from 0.1 mm to 3.0 mm, inclusive. For example, in a case where the cross section of the first braided line 40 is substantially in the shape of the circle, the diameter D3 of the first braided line 40 may be 0.1 mm, 2.0 mm or 3.0 mm; alternatively, in a case where the cross section of the first braided line 40 is substantially in the shape of the square, the width D3 of the first braided line 40 may be 0.1 mm, 2.0 mm or 3.0 mm. The width D3 of the first braided line 40 refers to a distance of the first braided line 40 in the direction parallel to the second direction Y and perpendicular to the first direction X.

In some examples, the plurality of second braided lines 50 extend in the second direction Y, and 1 to 4 second braided lines 50 are provided between two adjacent second strip-shaped circuit boards 20. For example, the number of the second braided lines 50 between the two adjacent second strip-shaped circuit boards 20 may be 1, 3 or 4. The second braided line 50 may be natural fiber, chemical fiber product, or a mixture of natural fiber and chemical fiber product. For example, the natural fiber may be cotton thread, hemp thread, silk thread, woolen thread, or the like, and the chemical fiber product may be nylon, polyester, spandex, chinlon, or the like. The second braided line 50 may be a line strip with a substantially circular or square cross section, and a diameter D4 or width D4 of the second braided line 50 may be in a range from 0.1 mm to 3.0 mm, inclusive. For example, in a case where the cross section of the second braided line 50 is substantially in the shape of a circle, the diameter D4 of the second braided line 50 may be 0.1 mm, 2.0 mm or 3.0 mm; alternatively, in a case where the cross section of the second braided line 50 is substantially in the shape of the square, the width D4 of the second braided line 50 may be 0.1 mm, 2.0 mm or 3.0 mm. The width D4 of the second braided line 50 refers to a distance of the second braided line 50 in the direction parallel to the first direction X and perpendicular to the second direction Y.

In some examples, the plurality of first braided lines 40, the plurality of second braided lines 50, the plurality of first strip-shaped circuit boards 10 and the plurality of second strip-shaped circuit boards 20 are braided to form a planar structure. The pixel unit 30 is provided at the intersection position O between the strip-shaped circuit board 10 and the second strip-shaped circuit board 20. The pixel unit 30 is electrically connected to the first strip-shaped circuit board 10 and the second strip-shaped circuit board 20, that is, the first strip-shaped circuit board 10 and the second strip-shaped circuit board 20 each transmit electrical signals to the pixel unit 30, and further control the pixel unit 30 to form a specific luminous intensity within a certain period of time. The plurality of pixel units 30 are arranged in an array on the whole braided planar structure. Pixel units 30, arranged in the first direction X, in the plurality of pixel units 30 is a row of pixel units 30, and all rows of pixel units 30 are sequentially refreshed in the second direction Y (the first direction X being perpendicular to the second direction Y). Therefore, the display image may be produced on the braided planar structure.

In some embodiments of the present disclosure, the first braided lines 40, the second braided lines 50, the first strip-shaped circuit boards 10, and the second strip-shaped circuit boards 20 are braided to form the planar structure. The first braided lines 40 and the second braided lines 50 may limit the displacement distance of the first strip-shaped circuit boards 10 relative to the second strip-shaped circuit boards 20 or limit the displacement distance of the second strip-shaped circuit boards 20 relative to the first strip-shaped circuit boards 10. Correspondingly, in a case where the border of the braided planar structure is subjected to external tensile force (e.g., the two ends of the braided planar structure are held by hands and pulled to generate the external tensile force), since the first strip-shaped circuit board 10 and the second strip-shaped circuit board 10 are limited in the displacement distance, that is, the deformation amount at the edge of the braided planar structure and the deformation amount in the middle of the braided planar structure have a small difference therebetween, the braided planar structure may be enlarged relatively uniformly due to the action of tension. That is, the amplification of the display image produced on the braided planar structure is uniform. The pixel resolution of the display image is reduced due to the image amplification, but the image will not be deformed.

Figure 5:
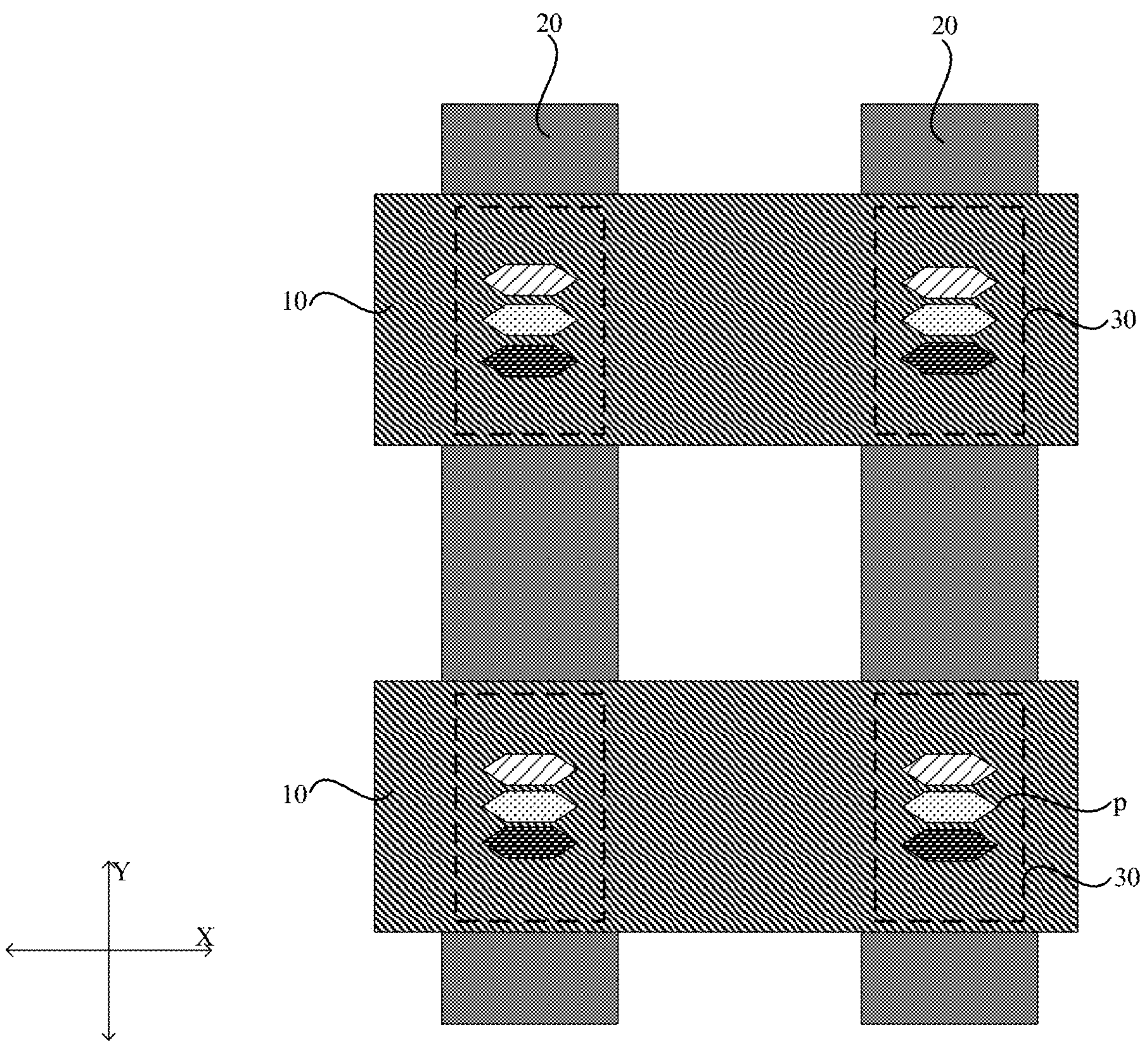
FIG. 5 is a structural diagram of first strip-shaped circuit boards and second strip-shaped circuit boards, in accordance with some embodiments of the present disclosure.
Figure 6:
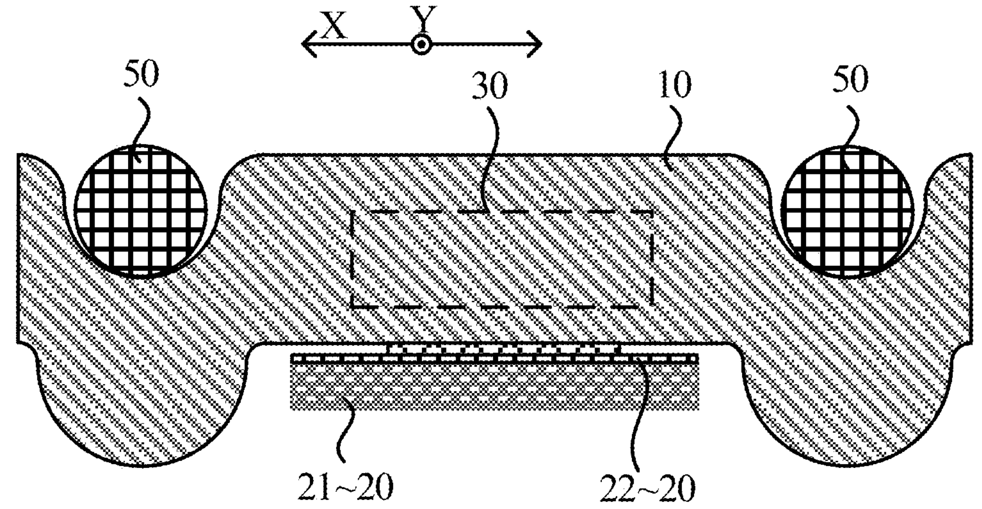
FIG. 6 is a cross-sectional view taken along the A-A direction in FIG. 4.

In some embodiments, as shown in FIGS. 5 and 6, where FIG. 5 is a structural diagram of relative positions of the first strip-shaped circuit boards 10 and the second strip-shaped circuit boards, and FIG. 6 is a cross-sectional view taken along the A-A direction in FIG. 4, the pixel unit 30 is fixed on the first strip-shaped circuit board 10, and the pixel unit 30 is in sliding contact with the second strip-shaped circuit board 20.

In some examples, the pixel unit 30 includes at least one sub-pixel p, and some of the at least one sub-pixel p may belong to a single pixel. For example, three of the at least one sub-pixel p belong to the single pixel, or four of the at least one sub-pixel p belong to the single pixel. The at least one sub-pixel p of each pixel unit 30 may be arranged in the second direction Y. For example, one sub-pixel p is fixed on the first strip-shaped circuit board 10, and is located at the intersection position between the first strip-shaped circuit board 10 and the second strip-shaped circuit board 20. Alternatively, three sub-pixels p are arranged in the second direction Y, fixed on the first strip-shaped circuit board 10, and located at the intersection position between the first strip-shaped circuit board 10 and the second strip-shaped circuit board 20. Different sub-pixels p may each display a single color, for example, a red sub-pixel may display red, a green sub-pixel may display green, or a blue sub-pixel may display blue. The pixel unit 30 is also in sliding contact with the second strip-shaped circuit board 20. In a relative sliding process of the first strip-shaped circuit board 10 and the second strip-shaped circuit board 20, the pixel unit 30 may slide relative to the second strip-shaped circuit board 20, and the pixel unit 30 remain electrically connected to the second strip-shaped circuit board 20, so as to meet the purpose of the display panel 100 being stretchable and the pixel unit 30 being capable work normally.

Figure 7:
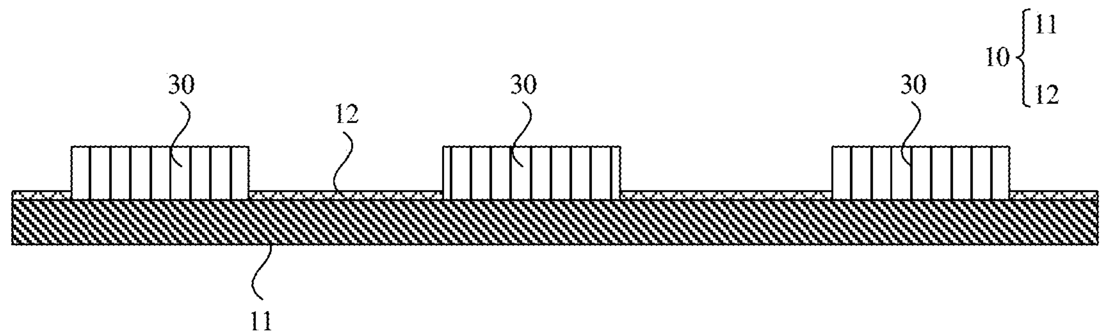
FIG. 7 is a structural diagram of a first strip-shaped circuit board, in accordance with some embodiments of the present disclosure.

In some embodiments, as shown in FIG. 7, the first strip-shaped circuit board 10 includes a first base 11 and a first conductive layer 12. The first conductive layer 12 includes at least one signal line, and the first conductive layer 12 is located on a side of the first base 11 away from the second strip-shaped circuit board 20. The at least one signal line is electrically connected to the pixel unit 30.

Figure 8:
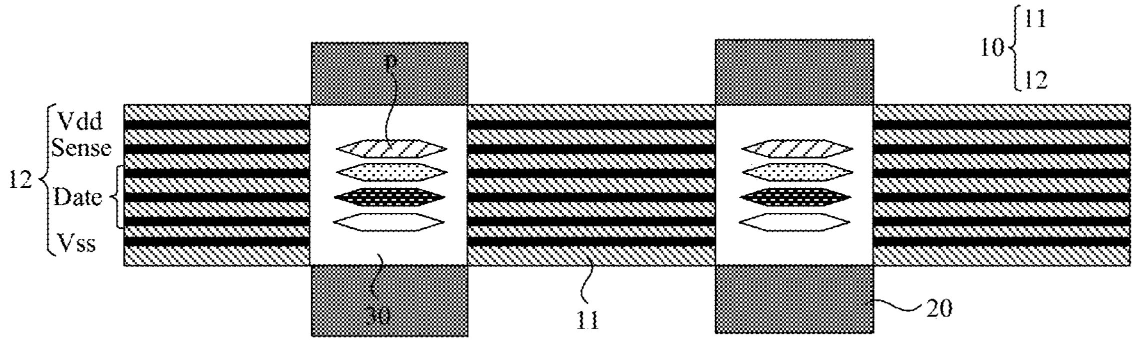
FIG. 8 is a top view of a first strip-shaped circuit board, in accordance with some embodiments of the present disclosure.

In some examples, the first base 11 has a strip structure with a substantially square cross section. The first base 11 is made of a flexible material. For example, the first base 11 may be made of polyimide (PI) or polyethylene terephthalate (PET). As shown in FIG. 8, the first conductive layer 12 is provided on the side of the first base 11 away from the second strip-shaped circuit board 20, and the first conductive layer 12 includes a plurality of signal lines. For example, the signal lines may include a first power supply voltage signal line Vdd, a second power supply voltage signal line Vss, sensing lines Sense and data lines Date. The pixel unit 30 on the first strip-shaped circuit board 10 is electrically connected to the first power supply voltage signal line Vdd, the second power supply voltage signal line Vss, the sensing line Sense and at least one data line Date of the first strip-shaped circuit board 10. For example, the pixel unit 30 includes at least one sub-pixel p, each sub-pixel p is electrically connected to the first power supply voltage signal line Vdd and the second power supply voltage signal line Vss, a sub-pixel p is electrically connected to a data line Date and a sensor line Sense. The data line Date is configured to provide a data signal for the sub-pixel p, and the sensing line Sense is configured to transmit a feedback current of the sub-pixel p.

The pixel unit 30 is disposed on the first strip-shaped circuit board 10, and the first base 11 of the first strip-shaped circuit board 10 is a flexible base, so that the pixel unit 30 may be amplified along with the first strip-shaped circuit board 10 being stretched. That is, the pixel unit 30 changes synchronously with the enlargement or reduction of the display panel. In other words, the space between multiple sub-pixels is enlarged, and correspondingly, the display image of the display panel is also uniformly enlarged without deformation of the display image.

It will be noted that the first conductive layer 12 may be made of aluminum, silver, copper, chromium, or the like. The first conductive layer 12 may be formed by metal sputtering or atomic vapor deposition, and line patterns are formed by an etching process, so as to realize the solution that the first conductive layer 12 includes the plurality of signal lines.

Figure 9:
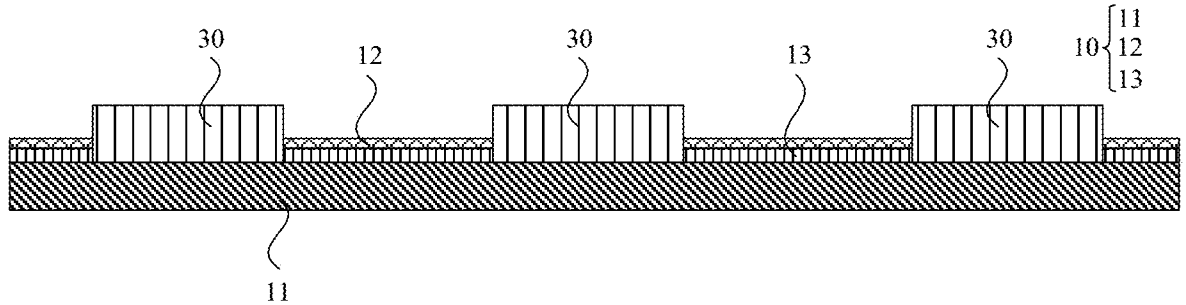
FIG. 9 is a structural diagram of another first strip-shaped circuit board, in accordance with some embodiments of the present disclosure.

In some embodiments, as shown in FIG. 9, the first strip-shaped circuit board 10 further includes an organic layer 13 located between the first base 11 and the first conductive layer 12.

For example, the organic layer 13 may use organic macromolecular polymer materials such as epoxy resin, acrylic resin, and silicone resin. The organic layer 13 is disposed between the first base 11 and the first conductive layer 12. The organic layer 13 is used to protect the plurality of signal lines of the first conductive layer 10 and increase the bending resistance of the first conductive layer 12, thereby avoiding non-recoverable bending of the first conductive layer 12 or a folded corner without a transition arc of the first conductive layer 12 after the first strip-shaped circuit board 10 is pressed by the second braided line 50.

Figure 10:
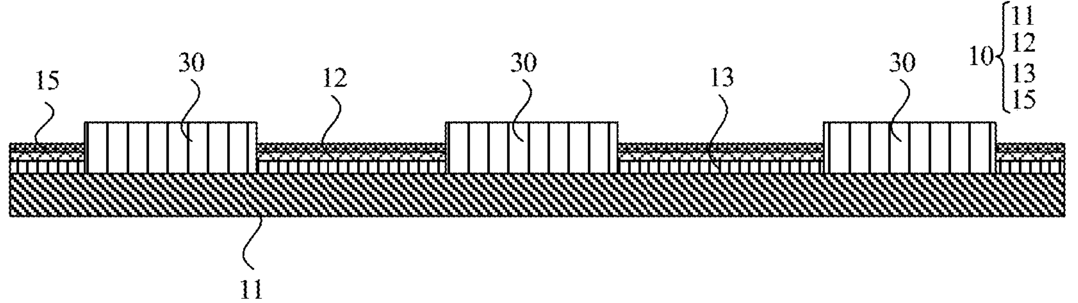
FIG. 10 is a structural diagram of yet another first strip-shaped circuit board, in accordance with some embodiments of the present disclosure.

In some embodiments, as shown in FIG. 10, the first strip-shaped circuit board 10 further includes a first planarization layer 15 located on a side of the first conductive layer 12 away from the base 11.

For example, the first planarization layer 15 is provided on the side of the first conductive layer 12 away from the first base 11, so that the first planarization layer 15 may fill the gaps between the line patterns of the first conductive layer 12 and cover the first conductive layer 12, which may have the function of protecting the first conductive layer 12 and provide a relatively flat processing surface for subsequent processes.

Figure 11:
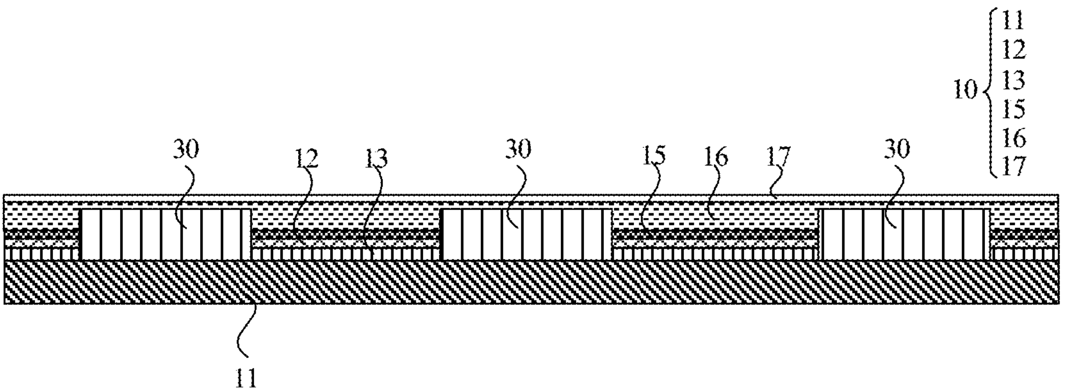
FIG. 11 is a structural diagram of yet another first strip-shaped circuit board, in accordance with some embodiments of the present disclosure.

In some embodiments, as shown in FIG. 11, the first strip-shaped circuit board 10 further includes a protective cover plate 17 and a first adhesive layer 16. The protective cover plate 17 covers the first planarization layer 15, and the first adhesive layer 16 is located between the protective cover plate 17 and the first planarization layer 15.

In some examples, the protective cover plate 17 may be a circular polarizer or made of a transparent organic macromolecular polymer. The transparent organic macromolecular polymer may be, for example, polyterephthalic acid plastic, polypropylene (PP) or polyethylene (PE). The protective cover plate 17 is used to protect the first strip-shaped circuit board 10 to avoid abrasion on the surface of the first strip-shaped circuit board 10.

The protective cover plate 17 and the first planarization layer 15 may be bonded by the first adhesive layer 16. The first adhesive layer 16 may use optically clear adhesive (OCA), so as to achieve the fix of the protection cover plate 17 and the first planarization layer 15.

Figure 12:
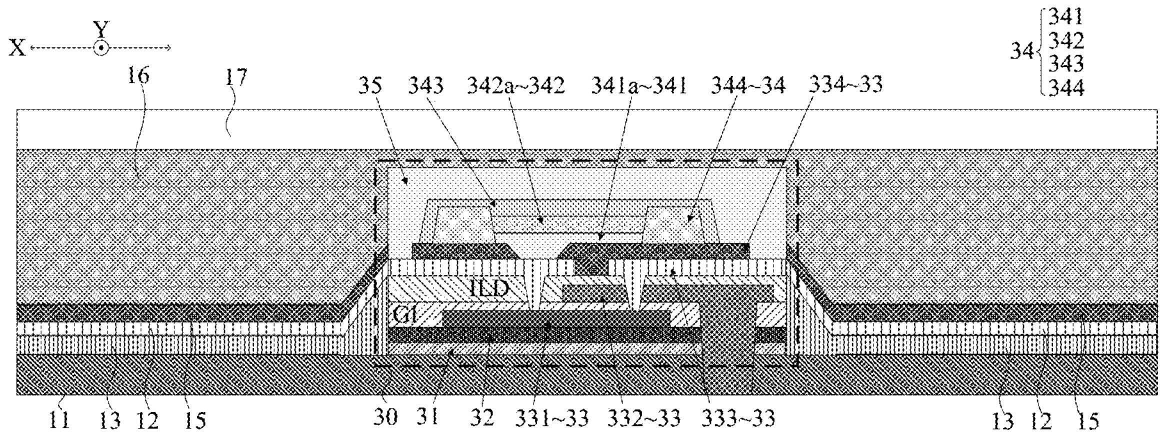
FIG. 12 is a cross-sectional view of yet another first strip-shaped circuit board and a pixel unit in a first direction, in accordance with some embodiments of the present disclosure.
Figure 13:
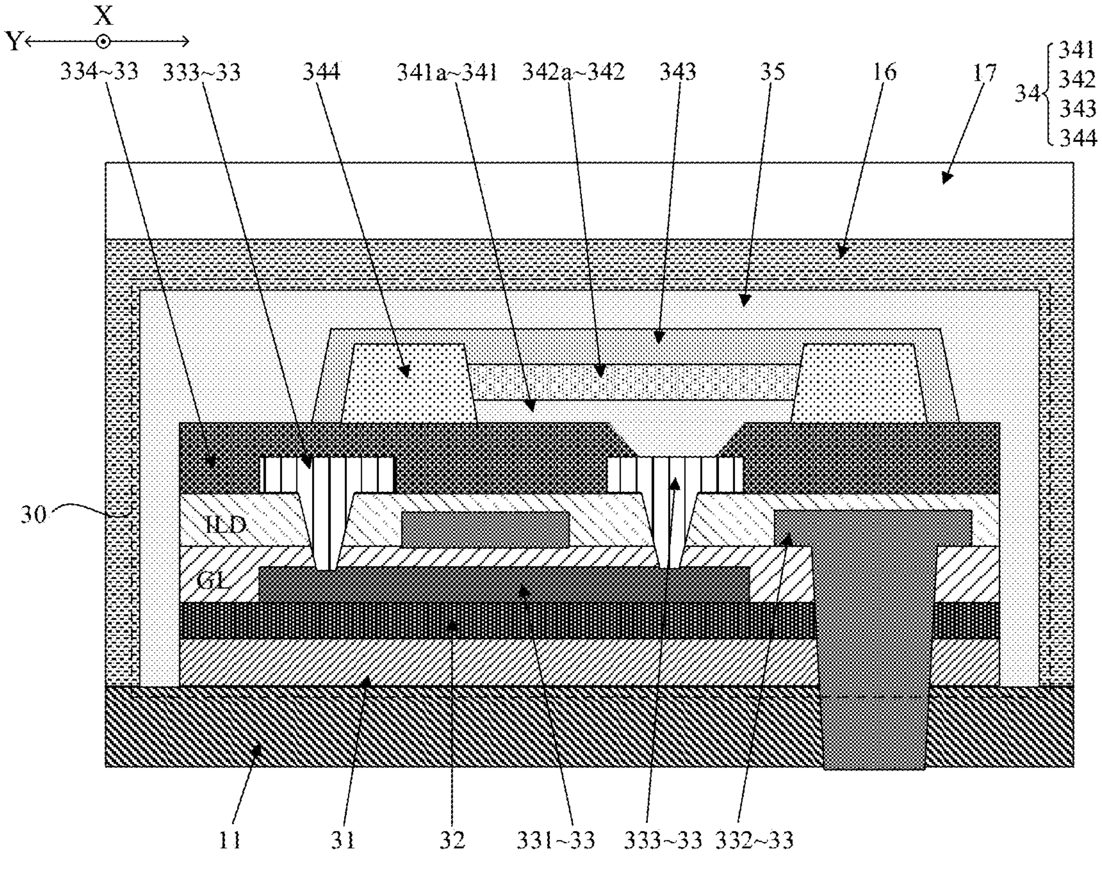
FIG. 13 is a cross-sectional view of a pixel unit in a second direction, in accordance with some embodiments of the present disclosure.

In some embodiments, as shown in FIGS. 12 and 13, where FIG. 12 is a cross-sectional view of the pixel unit 30 in the first direction X, and FIG. 13 is a cross-sectional view of the pixel unit 30 in the second direction Y, the pixel unit 30 includes a barrier layer 31, a buffer layer 32, a driving circuit layer 33, a light-emitting device layer 34 and an encapsulation layer 35. The driving circuit layer 33 is located on a side of the first base 11 away from the second strip-shaped circuit board. The barrier layer 31 is located between the first base 11 and the driving circuit layer 33. The buffer layer 32 is located between the barrier layer 31 and the driving circuit layer 33. The light-emitting device layer 34 is located on a side of the driving circuit layer 33 away from the first base 11. The encapsulation layer 35 is located on a side of the light-emitting device layer 34 away from the first base 11.

The organic layer 13 is in contact with the side surface of the driving circuit layer 33. The side surface of the barrier layer 31 and the side surface of the buffer layer 32 are both in contact with the organic layer 13.

In some embodiments, the barrier layer 31 is disposed at the intersection of the first base 11 and the second strip-shaped circuit board, and is located on the side of the first base 11 away from the second strip-shaped circuit board. The barrier layer 31 may be made of silicon nitride, silicon oxynitride, and other inorganic materials. The barrier layer 31 may prevent moisture from entering the driving circuit layer 33 and the light-emitting device layer 34 through the first base 11, and prevent the driving circuit layer 33 and the light-emitting device 34 from being corroded by moisture and oxygen, thereby improving the service life of the display panel.

The buffer layer 32, the driving circuit layer 33, the light-emitting device layer 34 and the encapsulation layer 35 are sequentially disposed on a side of the barrier layer 31 away from the second strip-shaped circuit board, so as to form the pixel unit 30. The driving circuit layer 33 includes at least one pixel driving circuit, and correspondingly, the light-emitting device layer 34 includes at least one light-emitting device. For example, a pixel driving circuit is electrically connected to the first power supply voltage signal line, a data line and a light-emitting device, and the light-emitting device is electrically connected to the second power supply voltage signal line. The first power supply voltage signal line is configured to provide a high-level signal for the pixel driving circuit, and the high-level signal may be, for example, a constant voltage signal with a voltage of 3.5V or 5.0V. The second power supply voltage signal line is configured to provide a low-level signal for the light-emitting device, and a voltage of the low-level signal may be, for example, zero. The data line is configured to provide a data signal for the pixel driving circuit. The data signal may control the current of the signal output by the pixel driving circuit, and further control the luminous brightness of the light-emitting device to generate different gray scales of the sub-pixels.

Figure 14:
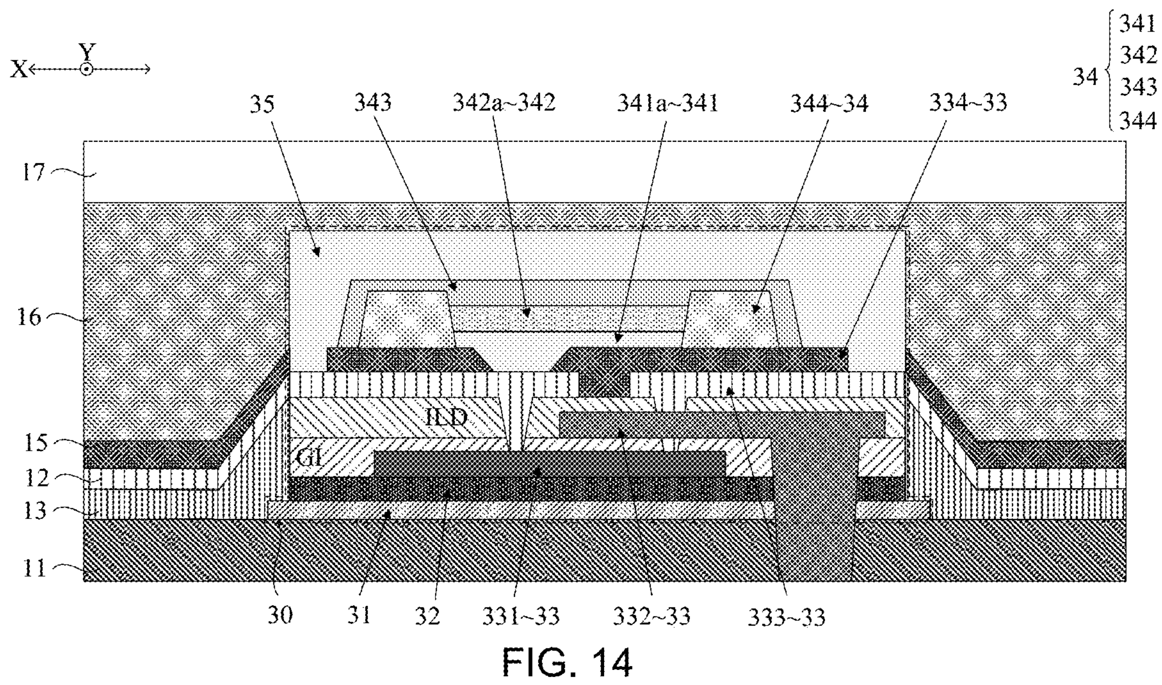
FIG. 14 is a cross-sectional view of yet another first strip-shaped circuit board and another pixel unit in a first direction, in accordance with some embodiments of the present disclosure.

In some embodiments, as shown in FIG. 14, where FIG. 14 is a cross-sectional view of the first strip-shaped circuit board and the pixel unit 30 in the first direction X, two opposite edges of the buffer layer 32 in the first direction X are retracted relative to two opposite edges of the barrier layer 31 in the first direction X.

Figure 16:
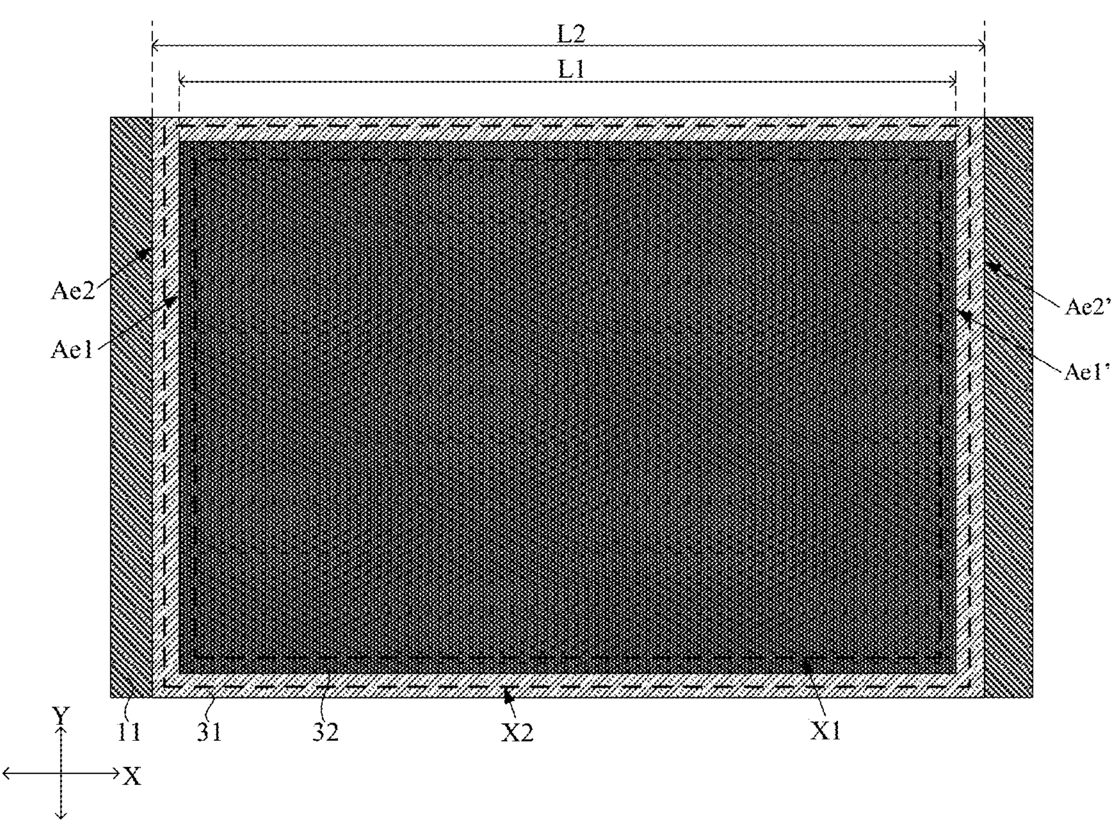
FIG. 16 is a structural diagram of a barrier layer and a buffer layer on a first base, in accordance with some embodiments of the present disclosure.

In some examples, as shown in FIG. 16, where FIG. 16 is a structure diagram of the barrier layer 31 and the buffer layer 32 on the first base 11 in some embodiments, the buffer layer 32 is disposed proximate to a first plane X1 of the driving circuit layer 33, and four sides perpendicular to the first plane X1 intersect to form four first edges. Among the four first edges, first edges perpendicular to the first direction X are a first edge Ae1 and another first edge Ae1', and the first edge Ae1 and the another first edge Ae1' are two opposite edges of the buffer layer 32 in the first direction X.

The barrier layer 31 is disposed proximate to a second plane X2 of the driving circuit layer 33, and four sides perpendicular to the second plane X2 intersect to form four second edges. Among the four second edges, second edges perpendicular to the first direction X are a second edge Ae2 and another second edge Ae2', and the second edge Ae2 and the another second edge Ae2' are two opposite edges of the barrier layer 31 in the first direction X.

A distance L1 between the first edge Ae1 and the another first edge Ae1' is smaller than a distance L2 between the second edge Ae2 and the another second edge Ae2', and the difference between the distance L2 and the distance L1 is greater than or equal to 5 μm.

Figure 15:
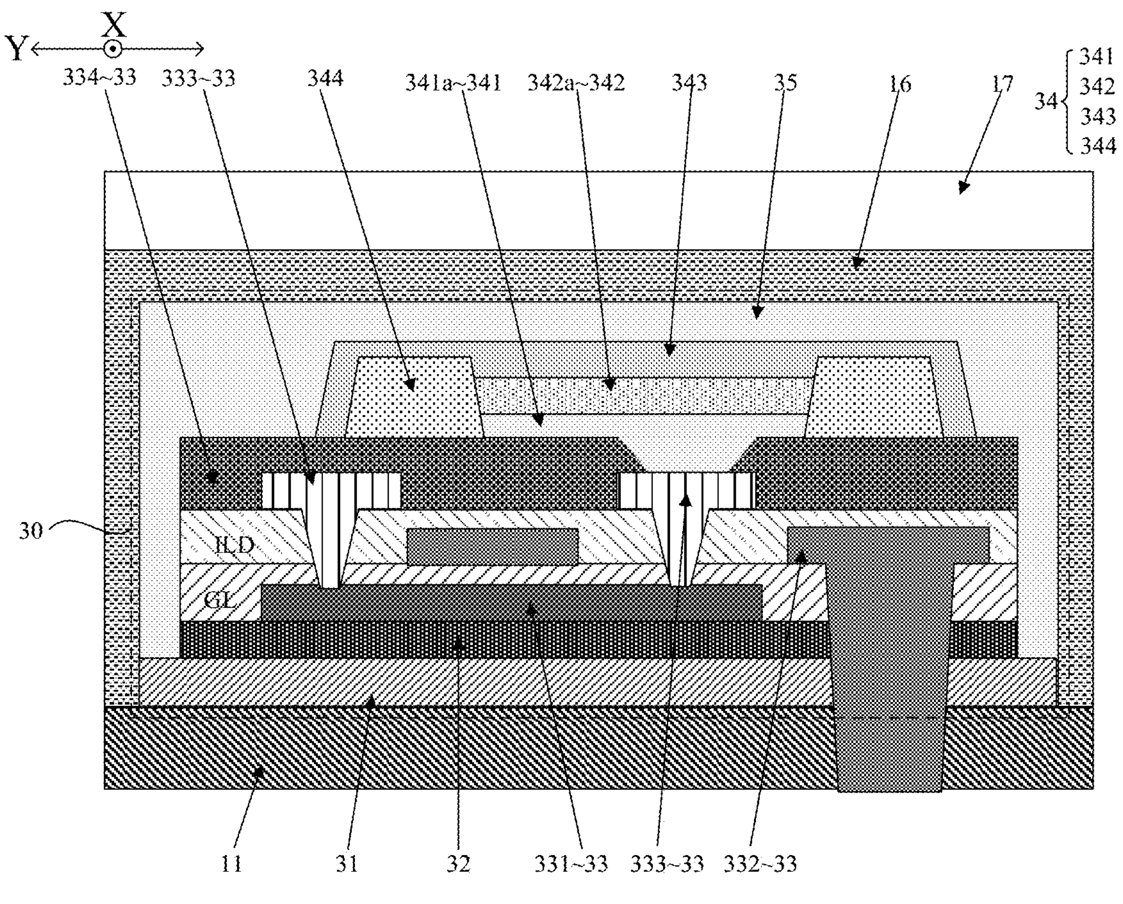
FIG. 15 is a cross-sectional view of another pixel unit in a second direction, in accordance with some embodiments of the present disclosure.

In some embodiments, as shown in FIGS. 15 and 16, where FIG. 15 is a cross-sectional view of the pixel unit in the second direction Y, the four first edges also include two first edges perpendicular to the second direction Y, and four second edges also include two second edges perpendicular to the second direction Y. A distance between the two first edges perpendicular to the second direction Y is smaller than a distance between the two second edges perpendicular to the second direction Y. The difference between the distance between the two first edges perpendicular to the second direction Y and the distance between the two second edges perpendicular to the second direction Y is greater than or equal to 5 μm.

In this way, the barrier layer 31 and the buffer layer 32 have a step therebetween. The first strip-shaped circuit board is deformed when being stretched, and the encapsulation layer 35 in the border area of the pixel unit 30 may produce micro cracks. Due to the step design between the barrier layer 31 and the buffer layer 32, when the first strip-shaped circuit board is stretched and deformed, the micro cracks generated will be blocked at the step. That is, the micro cracks generated between the organic layer 13 and both the barrier layer 31 and the buffer layer 32 may have no effect on the encapsulation layer 35, thereby improving the encapsulation yield.

In some embodiments, as shown in FIG. 12, FIG. 13, FIG. 14 or FIG. 15, the driving circuit layer 33 includes an active layer 331, a gate metal layer 332, a source-drain metal layer 333 and a pixel planarization layer 334. The active layer 331 is disposed on a side of the buffer layer 32 away from the first base 11. The gate metal layer 332 is disposed on a side of the active layer 331 away from the first base 11. The source-drain metal layer 333 is disposed on a side of the gate metal layer 331 away from the first base 11, and the first conductive layer 12 is disposed in the same layer as the source-drain metal layer 333. The pixel planarization layer 334 is disposed on a side of the source-drain metal layer 333 away from the first base 11, and the pixel planarization layer 334 is disposed in the same layer as the first planarization layer 15.

The driving circuit layer 33 further includes a gate insulating layer GI and an interlayer dielectric layer ILD. The gate insulating layer GI is disposed between the active layer 331 and the gate metal layer 332, and the gate insulating layer GI make the active layer 331 insulated from the gate metal layer 332. The interlayer dielectric layer ILD is disposed between the gate metal layer 332 and the source-drain metal layer 333, and the interlayer dielectric layer ILD is used to make the gate metal layer 332 insulated from the source-drain metal layer 333.

In some embodiments of the present disclosure, the driving circuit layer 33 includes at least one pixel driving circuit. A pixel driving circuit is electrically connected to a gate signal line, and the pixel driving circuit is configured to, under the control of a gate signal provided by the gate signal line, output a signal to the light-emitting device.

In some examples, the pixel driving circuit may be a "3T1C" circuit, where T represents a thin film transistor, the number before T represents the number of the thin film transistor(s), C represents a capacitor, and the number before C represents the number of the capacitor(s). For example, 3T1C represents 3 thin film transistors and 1 capacitor. The following will be described by considering an example of the 3T1C type of pixel driving circuit.

Figure 17:
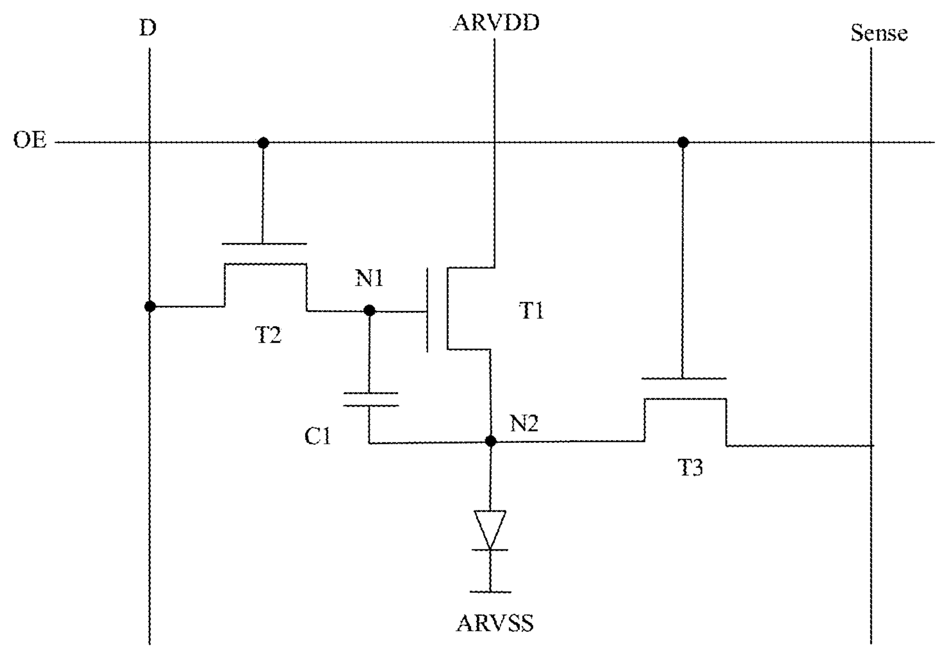
FIG. 17 is a diagram of a pixel driving circuit, in accordance with some embodiments of the present disclosure.

In some embodiments, as shown in FIG. 17, the 3T1C type of pixel driving circuit includes a first transistor T1, a second transistor T2, a third transistor T3 and a capacitor C1.

A control electrode of the first transistor T1 is electrically connected to a first node N1, a first electrode of the first transistor T1 is electrically connected to a first power supply voltage terminal ARVDD, and a second electrode of the first transistor T1 is electrically connected to a second node N2. A control electrode of the second transistor T2 is electrically connected to an enable signal terminal OE, a first electrode of the second transistor T2 is electrically connected to a data signal terminal D, and a second electrode of the second transistor T2 is electrically connected the first node N1. A control electrode of the third transistor T3 is electrically connected to the enable signal terminal OE, a first electrode of the third transistor T3 is electrically connected to the second node N2, and a second electrode of the third transistor T3 is electrically connected to a feedback signal terminal S. A first electrode plate of the capacitor C1 is electrically connected to the first node N1, and a second electrode plate of the capacitor C1 is electrically connected to the second node N2.

The first power supply voltage terminal ARVDD of each 3T1C type of pixel driving circuit is electrically connected to the corresponding first power supply voltage signal line VDD, the feedback signal terminal S of each 3T1C type of pixel driving circuit is electrically connected to the corresponding sensing line Sense, and the data signal terminal D of each 3T1C type of pixel driving circuit is electrically connected to the corresponding data line Date.

The active layer 331 includes active layer patterns of all the transistors in the above-mentioned pixel driving circuit, and the source-drain metal layer 333 is electrically connected to the active layer 331 through via holes in the interlayer dielectric layer ILD and the gate insulating layer GI. The source-drain metal layer 333 is electrically connected to the first conductive layer 12. For example, the source-drain metal layer 333 in an area of the pixel driving circuit is electrically connected to a first power supply voltage signal line, a data line and a light-emitting device. The gate metal layer 332 is electrically connected to the second strip-shaped circuit board 20. The second strip-shaped circuit board may be a gate signal line, and the second strip-shaped circuit board may be configured to provide a gate signal for the pixel driving circuit.

The pixel planarization layer 334 covers the source-drain metal layer 333 and forms a relatively flat surface which provides a prerequisite for the subsequent processes. The pixel planarization layer 334 and the first planarization layer 15 are arranged in the same layer. The first planarization layer 15 and the pixel planarization layer 334 are formed simultaneously, which may facilitate simplification of the production process. In addition, the encapsulation layer 35 separates the pixel planarization layer 334 from the first planarization layer 15, so that the encapsulation layer 35 extends to the source-drain metal layer 333, so as to improve the encapsulation effect, thereby avoiding cracks generated in the encapsulation layer 35 due to tensile deformation and preventing moisture and oxygen from entering the light-emitting device layer 34.

In some embodiments, as shown in FIG. 12, FIG. 13, FIG. 14 or FIG. 15, the light-emitting device layer 34 is located on a side of the pixel planarization layer 334 away from the first base 11.

In some examples, the light-emitting device layer 34 includes a pixel defining layer 344, an anode layer 341, a light-emitting layer 342, and a cathode layer 343. The pixel defining layer 344 is disposed on the side of the pixel planarization layer 334 away from the first base 11. The anode layer 341 is disposed on the side of the pixel planarization layer 334 away from the first base 11. The light-emitting layer 342 is disposed on a side of the anode layer 341 away from the first base 11. The cathode layer 343 is disposed on a side of the light-emitting layer 342 away from the first base 11. The pixel defining layer 344 is used to define the pixel position. The pixel defining layer 344 includes at least one opening. The anode layer 341 includes anodes 341*a*, the number of which corresponds to the number of the openings. The light-emitting layer 342 includes light-emitting portions 342*a*, the number of which corresponds to the number of the openings. An anode 341*a* and a light-emitting portion 342*a* are disposed in an opening.

Each anode 341*a* is connected to the source-drain metal layer 333 through a via hole in the pixel planarization layer 334, and the cathode layer 343 is connected to the source-drain metal layer 333 through another via hole in the pixel planarization layer 334. For example, the source-drain metal layer 333 includes a first pattern connected to the first power supply voltage signal line, a second pattern connected to the data line and a third pattern connected to the second power supply voltage signal line. The first pattern, the second pattern and the third pattern are insulated from each other. The first pattern and the second pattern are electrically connected to the active layer 331 respectively through a via hole in the interlayer dielectric layer ILD and a via hole in the gate insulating layer GI, and the third pattern is electrically connected to the cathode layer 343 through a via hole in the pixel planarization layer 334.

Figure 20:
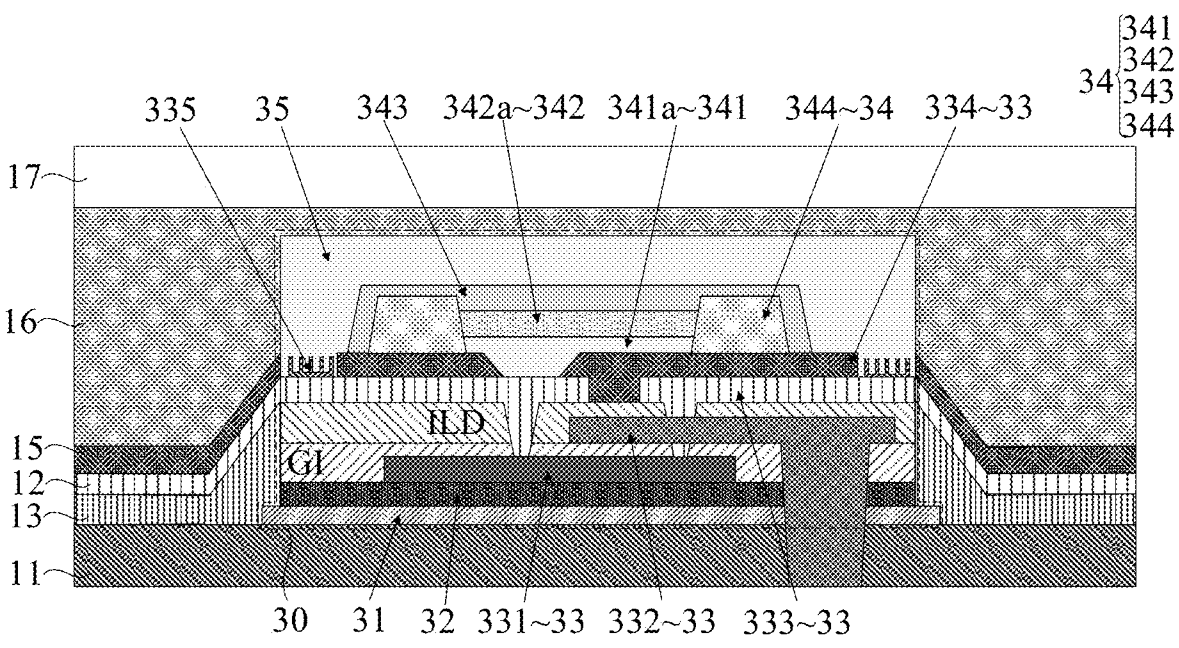
FIG. 20 is a cross-sectional view of yet another first strip-shaped circuit board and yet another pixel unit in a first direction, in accordance with some embodiments of the present disclosure.

In some embodiments, as shown in FIG. 20, the protective cover plate 17 covers the first planarization layer 15 and the encapsulation layer 35. The first adhesive layer 16 is located between the protective cover plate 17 and both the first planarization layer 15 and the encapsulation layer 35.

For example, the first adhesive layer 16 may be applied by coating on both the first planarization layer 15 of the first strip-shaped circuit board and the plurality of pixel units 30 on the first strip-shaped circuit board, and the protective cover plate 17 is attached to the first adhesive layer 16 applied on the first strip-shaped circuit board 10 and the plurality of pixel units 30. The protective cover plate 17 is used to protect the display surface side of the first strip-shaped circuit board 10 and the pixel units 30.

In some embodiments, as shown in FIG. 15, the first adhesive layer 16 is also applied by coating on two side faces, parallel in the first direction X, of the pixel unit 30, so as to cover the side faces of the encapsulation layer 35. Therefore, the encapsulation layer 35 may have a protective layer, thereby improving encapsulation effect and reliability.

For example, the first adhesive layer 16 covers the two side faces of the pixel unit 30 that are parallel in the first direction X, that is, covers the exposed side faces of the encapsulation layer 35. The first adhesive layer 16 may extend to the first base 11 or the gate metal layer 332.

Figure 18:
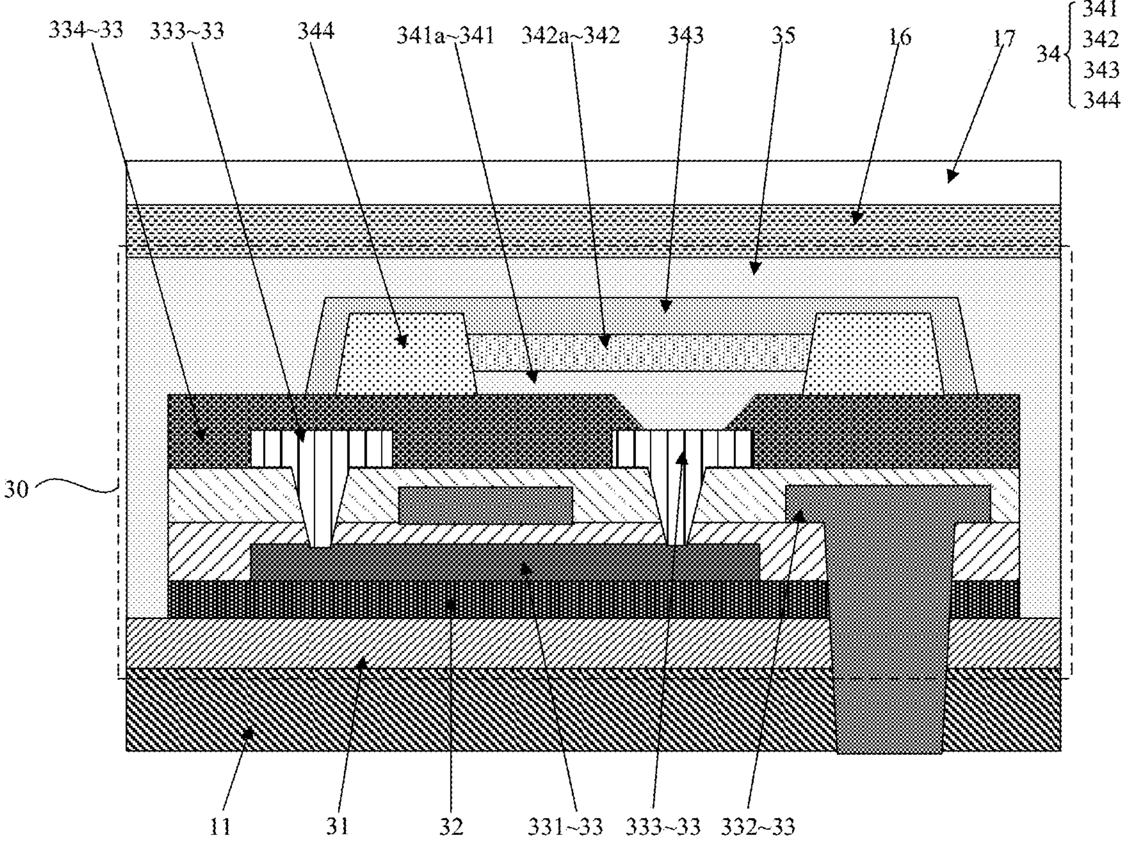
FIG. 18 is a cross-sectional view of yet another pixel unit in a second direction, in accordance with some embodiments of the present disclosure.

In some other embodiments, as shown in FIG. 18, the first adhesive layer 16 is only applied by coating on the encapsulation layer 35, and the two side faces of the pixel unit 30 that are parallel in the first direction X are exposed to the outside, that is, the encapsulation layer 35 is the outermost side of the pixel unit 30.

Figure 19:
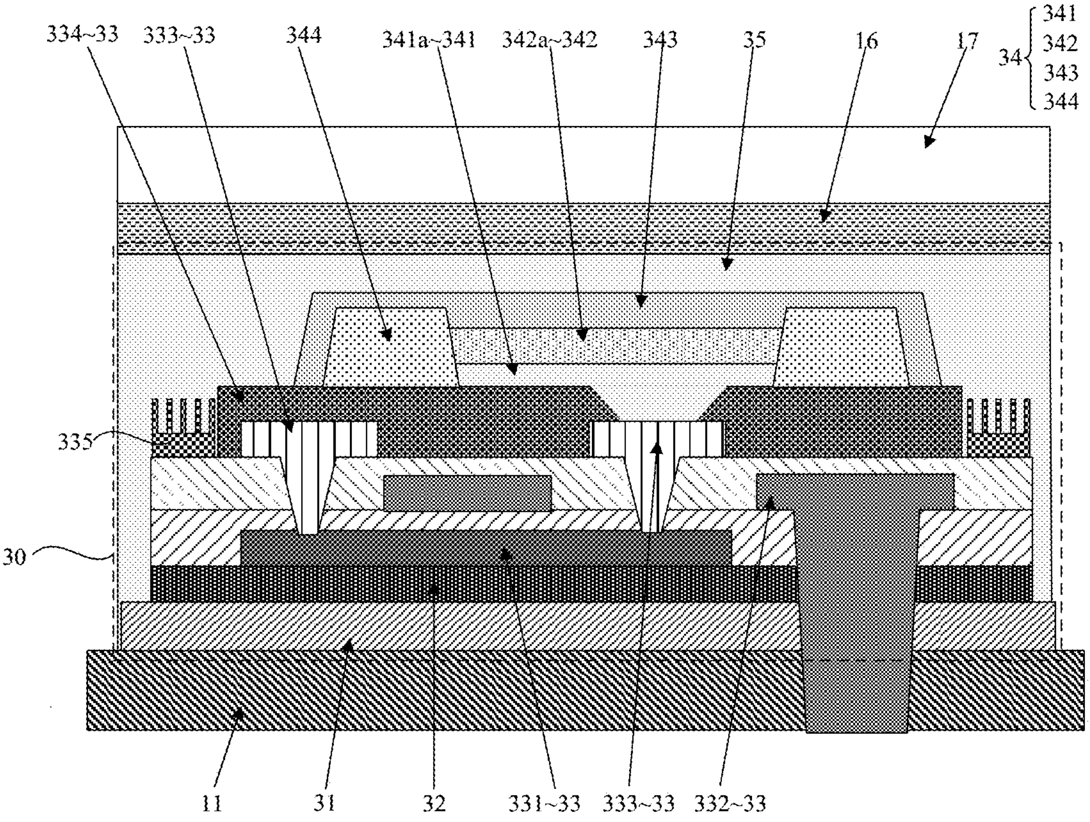
FIG. 19 is a cross-sectional view of yet another pixel unit in a second direction, in accordance with some embodiments of the present disclosure.

In some embodiments, as shown in FIGS. 19 and 20, the pixel unit 30 further includes a blocking layer 335. The blocking layer 335 is located between the pixel planarization layer 334 and the first planarization layer 15. At least one groove is provided in the surface of the blocking layer 335 away from the first base 11. The encapsulation layer 35 separates the pixel planarization layer 334 from the first planarization layer 15, and the encapsulation layer 35 fills the groove(s).

In some examples, the blocking layer 335 is made of inorganic materials such as silicon nitride or silicon oxide. The blocking layer 335 is located on the side of the interlayer dielectric layer ILD away from the first base 11. The blocking layer 335 is an annular film layer, and the pixel planarization layer 334 is in the inner circle of the blocking layer 335. At least one groove is disposed in the blocking layer 335, and the groove is arranged in a ring shape along the blocking layer 335. The encapsulation layer 35 covers the blocking layer 335 and fills the groove(s) in the blocking layer 335.

The blocking layer 335 may prolong the path of moisture and oxygen penetrating into the light-emitting device layer 34 from the side face of the pixel unit 30, thereby improving the encapsulation reliability.

Figure 21:
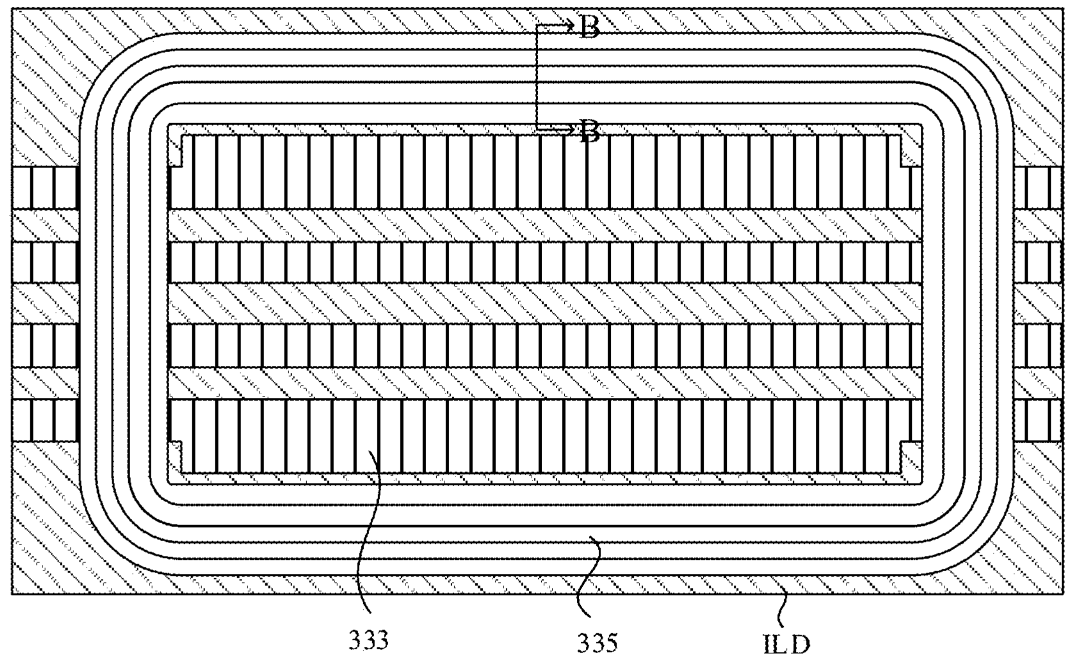
FIG. 21 is a structural diagram of a blocking layer on a pixel planarization layer, in accordance with some embodiments of the present disclosure.

In some embodiments, as shown in FIGS. 19, 20 and 21, the at least one groove includes a plurality of annular grooves surrounding the light-emitting device 34 and arranged diffusely from inside to outside.

Figure 22:
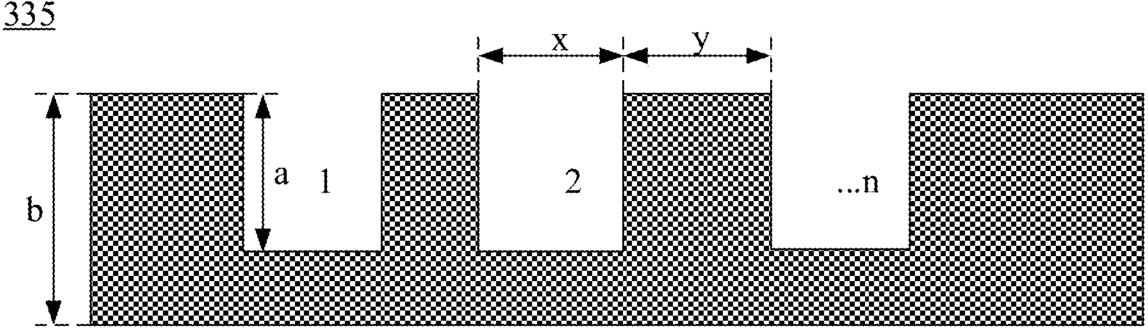
FIG. 22 is a cross-sectional view taken along the B-B direction in FIG. 21.

In some embodiments, as shown in FIGS. 21 and 22, where FIG. 22 is a cross-sectional view taken along the B-B direction in FIG. 21, the number n of the annular grooves is in a range of 2 to 6, inclusive. For example, the number n may be 2, 4 or 6.

In some embodiments, a thickness b of the blocking layer 335 is in a range of 0.4 μm to 1.4 μm, inclusive, such as 0.4 μm, 0.9 μm or 1.4 μm. A depth a of the annular groove is in a range of 0.2 μm to 1.2 μm, inclusive, such as 0.2 μm or 0.7 μm or 1.2 μm. A width x of the annular groove is in a range of 3 μm to 8 μm, inclusive, such as 3 μm, 6 μm or 8 μm. A distance y between two adjacent annular grooves is in a range of 3 μm to 8 μm, inclusive, such as 3 μm, 6 μm or 8 μm.

For example, the plurality of annular grooves may surround the light-emitting device 34. After the encapsulation layer 35 fills the grooves, the moisture and oxygen sealing path formed between the encapsulation layer 35 and the interlayer dielectric layer ILD may be prolonged, so as to provide the light-emitting device 34 with a complete and reliable isolation area, thereby improving the encapsulation reliability.

Figure 23:
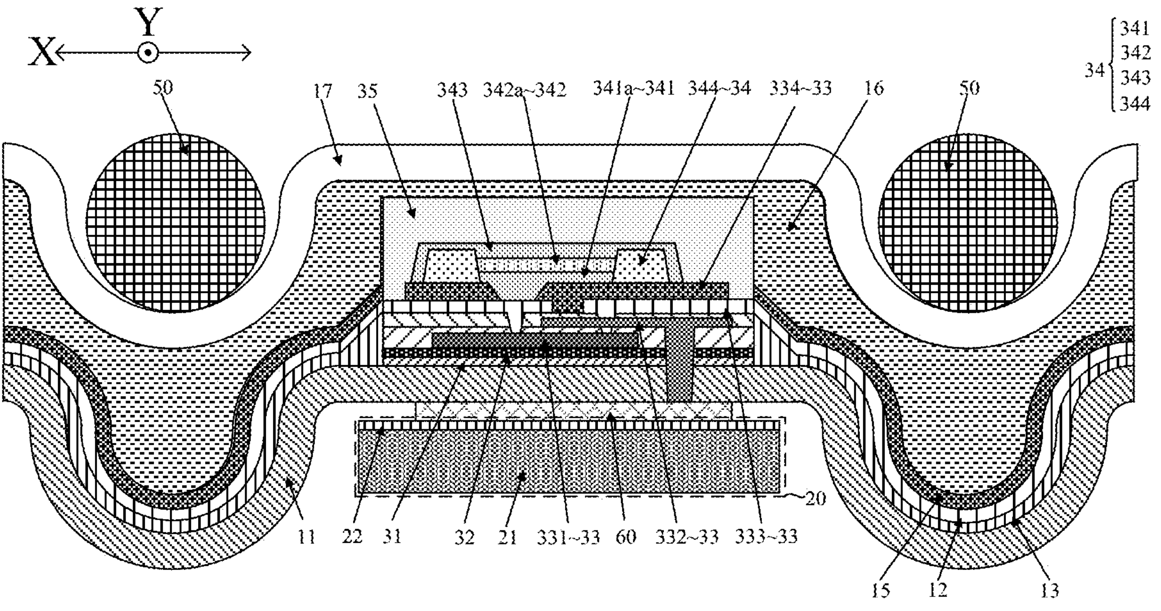
FIG. 23 is a cross-sectional view of yet another first strip-shaped circuit board and yet another pixel unit in a weaving state, in accordance with some embodiments of the present disclosure.

In some embodiments, as shown in FIG. 23, the second strip-shaped circuit board 20 includes a second base 21 and a second conductive layer 22. The second conductive layer 22 is at least disposed on a side of the second base 21 proximate to the first base 11, and the second conductive layer 22 is electrically connected to the driving circuit layer 33.

In some examples, the second base 21 may have a strip structure with a substantially square cross section. The second base 21 may be made of a flexible material. For example, the second base 21 may be made of polyimide or polyethylene terephthalate. The second conductive layer 22 is disposed on the side of the second base 21 proximate to the first base 11. The second conductive layer 22 may use a film layer made of metals or alloys such as molybdenum, iron-based alloys, or nickel-based alloys, or may be made of indium tin oxide, and indium zinc oxide, silver nanowires, carbon nanotubes, graphene, or the like. For example, the iron-based alloy may be stainless steel, and the nickel-based alloy may be nickel-chromium (Ni—Cr) alloy, nickel-copper (Ni—Cu) alloy and nickel-chromium-molybdenum (Ni—Cr—Mo) alloy. The second conductive layer 22 is configured to transmit a gate signal. For example, the second conductive layer 22 may be electrically connected to the enable signal terminal OE of the corresponding 3T1C type of pixel driving circuit.

In some embodiments, as shown in FIG. 23, the display panel further includes a plurality of contact layers 60, and at least one contact layer 60 is located at an intersection position between a second strip-shaped circuit board 20 in the plurality of second strip-shaped circuit boards 20 and a first strip-shaped circuit board 10 in the plurality of first strip-shaped circuit boards 10 and located between the first base 11 and the second conductive layer 22. The gate metal layer 332 is fixedly and electrically connected to the contact layer 60 through a via hole penetrating the first base 11, and the contact layer 60 is slidably electrically connected to the second conductive layer 22.

In some examples, each pixel unit corresponds to at least one contact layer 60, the contact layer 60 is relatively fixed to the first strip-shaped circuit board, and the contact layer 60 is relatively sliding to the second strip-shaped circuit board 20. The gate metal layer 332 and the second conductive layer 22 are both electrically connected to the contact layer 60. The contact layer 60 may be made of conductive metals and oxides thereof such as molybdenum, indium tin oxide and indium zinc oxide. A length of the contact layer 60 in the first direction X is less than or equal to a width of the second strip-shaped circuit board 20, and a length of the contact layer 60 in the second direction Y is less than or equal to a width of the first strip-shaped circuit board 10.

In a specific application process, the second conductive layer 22 is configured to transmit a gate signal. When the display panel is deformed due to external tensile force, the first strip-shaped circuit board is offset relative to the second strip-shaped circuit board 20. Due to the action of the first braided line 40 and the second braided line 50, the contact layer 60 and the second strip-shaped circuit board 20 slide relatively and keep in contact during deformation. That is to say, the contact layer 60 is in contact with the second strip-shaped circuit board 20 due to the action of the pressure of the first braided line 40 and the second braided lines 50 (the first braided line 40 and the second braided line 50 press the first strip-shaped circuit board towards the second strip-shaped circuit board 20), so as to ensure that the gate signal is transmitted to the gate metal layer 332.

Figure 24:
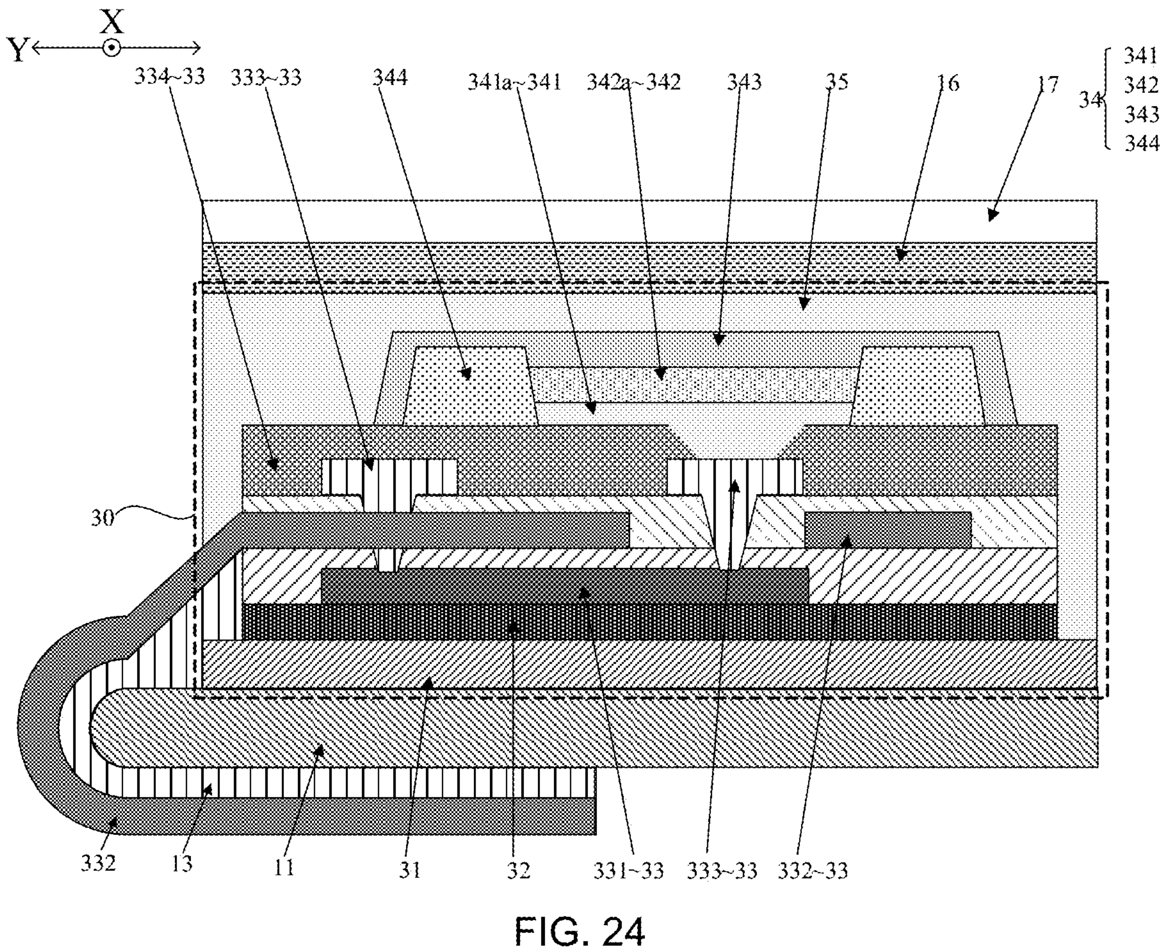
FIG. 24 is a cross-sectional view of a fifth type of pixel unit in a second direction, in accordance with some embodiments of the present disclosure.

In some other embodiments, as shown in FIG. 24, at least one end of the gate metal layer 332 in the second direction Y extends to a side of the first base 11 away from the source-drain metal layer 333, and is slidably electrically connected to the second conductive layer.

In some examples, after the gate metal layer 332 extends from at least one side face in the second direction Y of the pixel unit 30 to the outside of the pixel unit 30, the gate metal layer 332 continues to extend to the side of the first base 11 away from the source-drain metal layer 333, and is in sliding contact with the second conductive layer.

Figure 25:
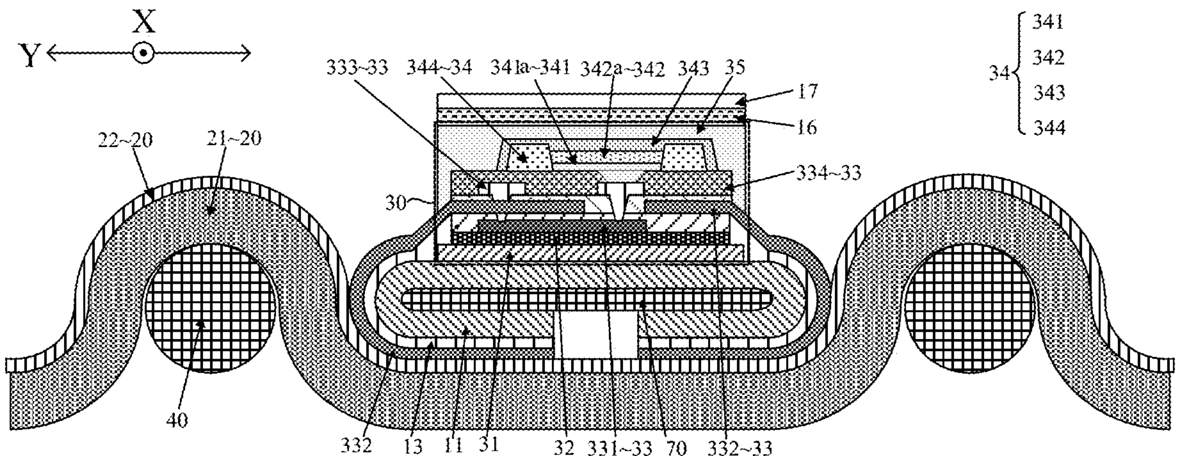
FIG. 25 is a cross-sectional view of a second strip-shaped circuit board and a sixth type of pixel unit in a weaving state, in accordance with some embodiments of the present disclosure.

In some other examples, as shown in FIG. 25, the gate metal layer 332 may extend from two side faces in the second direction Y of the pixel unit 30 to the outside of the pixel unit 30, and the gate metal layer 332 extending from the two side faces of the pixel unit 30 both continue to extend to the side of the first base 11 away from the source-drain metal layer 333, and are in sliding contact with the second conductive layer 22.

The width of the gate metal layer 332 extending to the side of the first base 11 away from the source-drain metal layer 333 is equal to the width of the first strip-shaped circuit board 10. The width of the gate metal layer 332 extending to the side of the first base 11 away from the source-drain metal layer 333 is a distance in the second direction Y of the gate metal layer 332 extending to the side of the first base 11 away from the source-drain metal layer 333.

In some embodiments, as shown in FIGS. 24 and 25, the organic layer 13 is further disposed between the gate metal layer 332 and the first base 11.

In some examples, the organic layer 13 is disposed in the gap between the gate metal layer 332 outside the pixel unit 30 and the first base 11. The organic layer 13 may avoid direct contact between the first base 11 and the gate metal layer 332, and avoid relative friction between the first base 11 and the gate metal layer 332 when the first base 11 is deformed by tensile force. As a result, the wear of the first base 11 may be improved, thereby improving quality and life of the display panel.

In some embodiments, as shown in FIG. 25, the first strip-shaped circuit board 10 further includes a wire core 70. The wire core 70 is located on the side of the first base 11 away from the source-drain metal layer 333, and the first base 11 is fixed around the core 70.

In some examples, the first base 11 may wrap the wire core 70, and the wire core 70 may adopt natural fiber, chemical fiber product or a mixture of natural fiber and chemical fiber product. For example, the natural fiber may be cotton thread, hemp thread, silk thread, woolen thread, or the like, and the chemical fiber product may be nylon, polyester, spandex, chinlon, or the like. The wire core 70 may increase the tensile resistance performance of the first strip-shaped circuit board 10 and thus improve the overall strength of the display panel 100.

Figure 26:
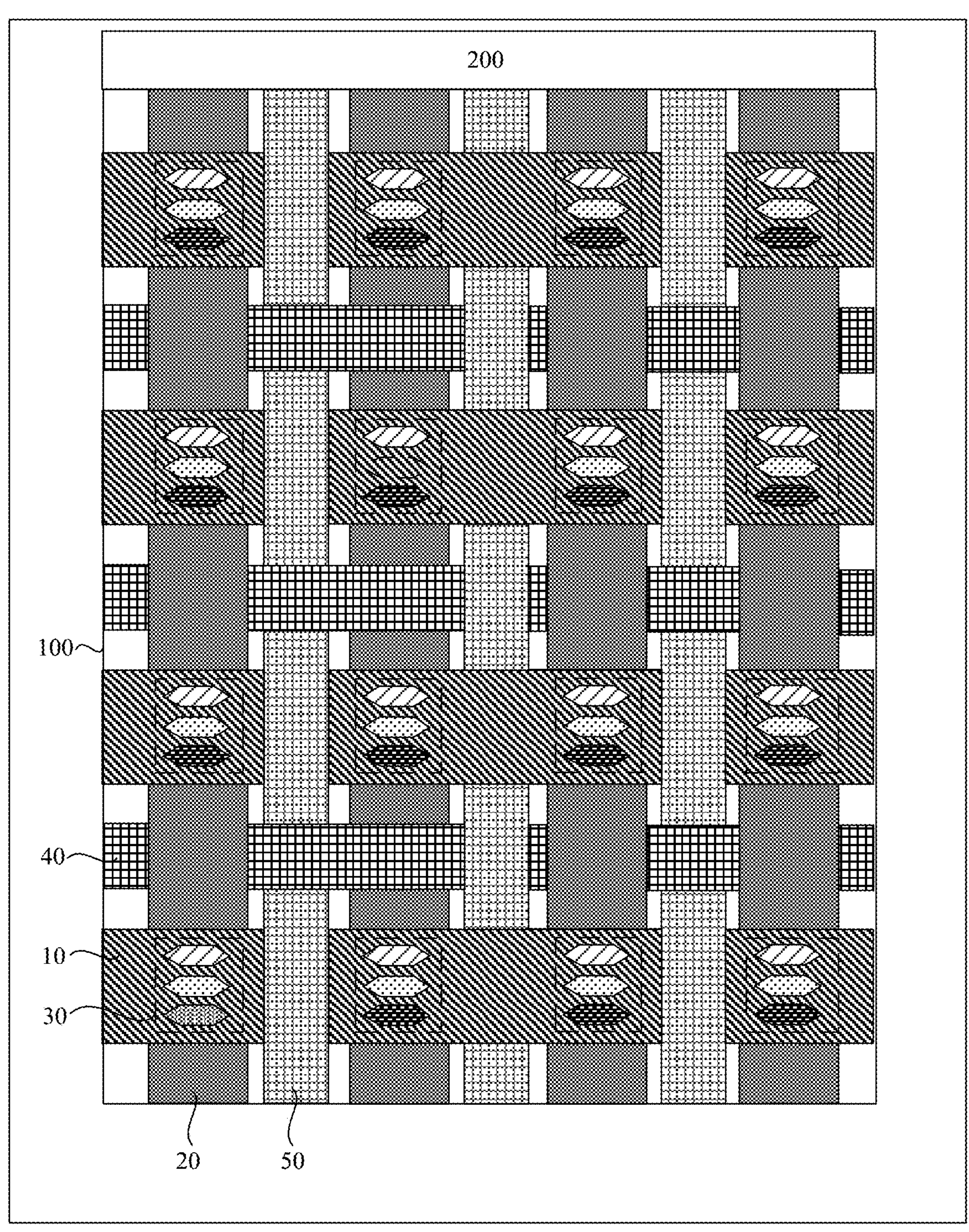
FIG. 26 is a structural diagram of a display apparatus, in accordance with some embodiments of the present disclosure.

In some embodiments, as shown in FIGS. 4 and 26, the plurality of first strip-shaped circuit boards 10, the plurality of second strip-shaped circuit boards 20, the plurality of first braided lines 40 and the plurality of second braided lines 50 are braided to form the planar structure adopting a plain weaving method.

In some examples, the display panel 100 has the planar structure braided by a plain weaving method. The plain weaving method refers to that a longitude line extends in a certain direction and alternately interspersed on both sides of a plurality of latitude lines, while a latitude line extends in another certain direction and alternately interspersed on both sides of a plurality of longitude lines, so as to form a planar braided structure.

For example, a specific braided structure by the plain weaving of the display panel 100 in some embodiments of the present disclosure is as that: the plurality of first strip-shaped circuit boards 10 are located on a side of the plurality of second strip-shaped circuit boards 20, the plurality of second braided lines 50 are located on a side of the plurality of first strip-shaped circuit boards 10 away from the plurality of second strip-shaped circuit boards 20, the plurality of first braided lines 40 each include a first braided sub-line and a second braided sub-line that are adjacent, and the first braided sub-line and the second braided sub-line are located on both sides of the same second braided line 50 and located on the same side of the same second strip-shaped circuit board 20.

It will be noted that some embodiments of the present disclosure provide the plain weaving method as the weaving method of the display panel 100, but it is not limited to the plain weaving method as the only weaving method. In addition, other weaving methods that may satisfy the above electrical connection manner are also possible, such as twill weaving method.

In another aspect, as shown in FIG. 26, some embodiments of the present disclosure provide a display apparatus 1000. The display apparatus 1000 includes the display panel 100 as described in any of the above embodiments and a driver chip 200. For example, the driver chip 200 is arranged on the first strip-shaped circuit board 10, and the first strip-shaped circuit board 10 is configured to transmit a data signal, a high voltage signal and a low voltage signal. The number of signals transmitted by the first strip-shaped circuit board 10 is large than the number of signals transmitted by the second strip-shaped circuit board 10. Therefore, the driver chip 200 is arranged on the first strip-shaped circuit board 10, so as to facilitate the connection between the driver chip 200 and the first strip-shaped circuit board 10, thereby improving the signal stability and quality and life of the product. In addition, the appearance of the first strip-shaped circuit board 10 may provide a fixed substrate for the driver chip 200 relative to the low flexibility of the first braided line 40. The driver chip 200 is configured to provide a high voltage signal, a low voltage signal and a data signal for the pixel unit 30.

The display apparatus 1000 adopts the display panel 100 provided by any of the above-mentioned embodiments, and has the same functions and advantages as the display panel 100, which will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a plurality of first strip-shaped circuit boards all extend in a first direction;

a plurality of second strip-shaped circuit boards all extend in a second direction, wherein the second direction intersects the first direction, and the plurality of second strip-shaped circuit boards and the plurality of first strip-shaped circuit boards are arranged in a cross way;

a plurality of pixel units, wherein a pixel unit is located at an intersection position between a second strip-shaped circuit board in the plurality of second strip-shaped circuit boards and a first strip-shaped circuit board in the plurality of first strip-shaped circuit boards, and is electrically connected to both the first strip-shaped circuit board and the second strip-shaped circuit board that cross at the intersection position;

a plurality of first braided lines all extend in the first direction, the plurality of first braided lines and the plurality of first strip-shaped circuit boards being arranged alternately; and a plurality of second braided lines all extend in the second direction, the plurality of second braided lines and the plurality of second strip-shaped circuit boards being arranged alternately, wherein the plurality of first braided lines and the plurality of second braided lines are connected with the plurality of first strip-shaped circuit boards and the plurality of second strip-shaped circuit boards in a braiding way;

the pixel unit is fixed on the first strip-shaped circuit board, and the pixel unit is in sliding contact with the second strip-shaped circuit board;

the first strip-shaped circuit board includes:

a first base; and a first conductive layer including at least one signal line: the first conductive layer being located on a side of the first base away from the second strip-shaped circuit board, wherein the at least one signal line is electrically connected to the pixel unit; and the pixel unit includes a driving circuit layer; the driving circuit layer is located on the side of the first base away from the second strip-shaped circuit board, and the driving circuit layer includes a source-drain metal laver, wherein the first conductive layer and the source-drain metal layer are disposed in a same layer.

2. The display panel according to claim 1, wherein the first strip-shaped circuit board further includes:

an organic layer located between the first base and the first conductive layer, and the organic layer being in contact with a side surface of the driving circuit layer.

3. The display panel according to claim 2, wherein the pixel unit further includes:

a barrier layer located between the first base and the driving circuit layer; and a buffer layer located between the barrier layer and the driving circuit layer, wherein both a side surface of the barrier layer and a side surface of the buffer layer are in contact with the organic layer.

4. The display panel according to claim 3, wherein two opposite edges of the buffer layer in the first direction are retracted relative to two opposite edges of the barrier layer in the first direction.

5. The display panel according to claim 1, wherein the driving circuit layer further includes:

a pixel planarization layer located on a side of the source-drain metal layer away from the first base; and the first strip-shaped circuit board further includes a first planarization layer located on a side of the first conductive layer away from the first base, wherein the pixel planarization layer is disposed in a same layer as the first planarization layer; and the pixel unit further includes a light-emitting device layer and an encapsulation layer; the light-emitting device layer is located on a side of the pixel planarization layer away from the first base, the encapsulation layer is located on a side of the light-emitting device layer away from the first base, and the encapsulation layer separates the pixel planarization layer from the first planarization layer.

6. The display panel according to claim 5, wherein the pixel unit further includes:

a blocking layer located between the pixel planarization layer and the first planarization layer, wherein a surface of the blocking layer away from the first base is provided at least one groove therein, and the encapsulation layer fills the at least one groove.

7. The display panel according to claim 6, wherein the light-emitting device layer includes at least one light-emitting device; the at least one groove includes a plurality of annular grooves each surrounding a light-emitting device and arranged diffusely from inside to outside.

8. The display panel according to claim 7, wherein a number of the annular grooves is in a range of 2 to 6, inclusive.

9. The display panel according to claim 7, wherein a thickness of the blocking layer is in a range of 0.4 μm to 1.4 μm, inclusive; a depth of an annular groove is in a range of 0.2 μm to 1.2 μm, inclusive; a width of the annular groove is in a range of 3 μm to 8 μm, inclusive; and a distance between two adjacent annular grooves is in a range of 3 μm to 8 μm, inclusive.

10. The display panel according to claim 5, wherein the first strip-shaped circuit board further includes:

a protective cover plate covering the first planarization layer and the encapsulation layer; and a first adhesive layer located between the protective cover plate and both the first planarization layer and the encapsulation layer.

11. The display panel according to claim 1, wherein the second strip-shaped circuit board includes:

a second base; and a second conductive layer disposed at least on a side of the second base proximate to the first base, and the second conductive layer being electrically connected to the driving circuit layer.

12. The display panel according to claim 11, further comprising a plurality of contact layers, wherein at least one contact layer is located at the intersection position between the second strip-shaped circuit board in the plurality of second strip-shaped circuit boards and the first strip-shaped circuit board in the plurality of first strip-shaped circuit boards, and is located between the first base and the second conductive layer;

the driving circuit layer further includes a gate metal layer;

the gate metal layer is fixedly and electrically connected to the contact layer through a via hole penetrating the first base; and the contact layer is slidably electrically connected to the second conductive layer.

13. The display panel according to claim 12, wherein at least one end of the gate metal layer in the second direction extends to a side of the first base away from the source-drain metal layer, and is slidably electrically connected to the second conductive layer.

14. The display panel according to claim 13, wherein the first strip-shaped circuit board further includes an organic layer located between the first base and the first conductive layer, and between the gate metal layer and the first base.

15. The display panel according to claim 1, wherein the first strip-shaped circuit board further includes a wire core; the wire core is located on a side of the first base away from the source-drain metal layer; and the first base is fixed around the wire core.

16. The display panel according to claim 1, wherein the plurality of first strip-shaped circuit boards, the plurality of second strip-shaped circuit boards, the plurality of first braided lines and the plurality of second braided lines are braided into a planar structure by a plain weaving method.

17. A display apparatus, comprising:

the display panel according to claim 1; and a driver chip disposed on the first strip-shaped circuit board; and the driver chip being configured to provide a power signal and a data signal for the pixel unit.

18. A display panel, comprising:

a plurality of first strip-shaped circuit boards all extend in a first direction;

a plurality of second strip-shaped circuit boards all extend in a second direction, wherein the second direction intersects the first direction, and the plurality of second strip-shaped circuit boards and the plurality of first strip-shaped circuit boards are arranged in a cross way;

a plurality of pixel units, wherein a pixel unit is located at an intersection position between a second strip-shaped circuit board in the plurality of second strip-shaped circuit boards and a first strip-shaped circuit board in the plurality of first strip-shaped circuit boards, and is electrically connected to both the first strip-shaped circuit board and the second strip-shaped circuit board that cross at the intersection position;

a plurality of first braided lines all extend in the first direction, the plurality of first braided lines and the plurality of first strip-shaped circuit boards being arranged alternately; and a plurality of second braided lines all extend in the second direction, the plurality of second braided lines and the plurality of second strip-shaped circuit boards being arranged alternately, wherein the plurality of first braided lines and the plurality of second braided lines are connected with the plurality of first strip-shaped circuit boards and the plurality of second strip-shaped circuit boards in a braiding way;

the pixel unit is fixed on the first strip-shaped circuit board, and the pixel unit is in sliding contact with the second strip-shaped circuit board;

the first strip-shaped circuit board includes:

a first base; and a first conductive layer including at least one signal line; the first conductive layer being located on a side of the first base away from the second strip-shaped circuit board, wherein the at least one signal line is electrically connected to the pixel unit;

the pixel unit includes a driving circuit layer located on the side of the first base away from the second strip-shaped circuit board, and the driving circuit layer includes a source-drain metal layer; and the first strip-shaped circuit board further includes a wire core; the wire core is located on a side of the first base away from the source-drain metal layer, and the first base is fixed around the wire core.

* * * * *